United States Patent
Park et al.

(10) Patent No.: US 8,552,733 B2
(45) Date of Patent: Oct. 8, 2013

(54) ELECTRICAL LEAK DETECTING APPARATUS FOR AN ELECTRIC VEHICLE

(75) Inventors: Hyunseok Park, Seoul (KR); Sebong Cho, Gyeonggi-do (KR); Ywunseok Jeon, Seoul (KR)

(73) Assignee: Kefico Corporation, Gyeonggi-Do (KR)

( * ) Notice: Subject to any disclaimer, the term of this patent is extended or adjusted under 35 U.S.C. 154(b) by 530 days.

(21) Appl. No.: 12/921,426

(22) PCT Filed: Apr. 14, 2009

(86) PCT No.: PCT/KR2009/001920
§ 371 (c)(1),
(2), (4) Date: Sep. 8, 2010

(87) PCT Pub. No.: WO2009/128641
PCT Pub. Date: Oct. 22, 2009

(65) Prior Publication Data
US 2011/0006777 A1    Jan. 13, 2011

(30) Foreign Application Priority Data

Apr. 14, 2008  (KR) .......................... 10-2008-0034108
Nov. 27, 2008  (KR) .......................... 10-2008-0119085
Apr. 10, 2009  (KR) .......................... 10-2009-0031418

(51) Int. Cl.
*G01R 31/14* (2006.01)
*G01R 31/02* (2006.01)

(52) U.S. Cl.
CPC .................................. *G01R 31/025* (2013.01)
USPC ....................................................... 324/509

(58) Field of Classification Search
None
See application file for complete search history.

(56) References Cited

U.S. PATENT DOCUMENTS

| | | | |
|---|---|---|---|
| 5,382,946 A | 1/1995 | Gale | |
| 6,320,389 B1 | 11/2001 | Tamesue et al. | |
| 6,700,384 B2 | 3/2004 | Yugou | |
| 6,731,116 B2 * | 5/2004 | Yamamoto et al. | 324/522 |
| 6,998,819 B2 | 2/2006 | Jin | |
| 7,592,815 B2 * | 9/2009 | Yano | 324/509 |

FOREIGN PATENT DOCUMENTS

| | | | |
|---|---|---|---|
| KR | 1019990037526 A | 5/1999 | |
| KR | 1020030010582 A | 2/2003 | |

* cited by examiner

*Primary Examiner* — Paresh Patel
(74) *Attorney, Agent, or Firm* — Hoffman & Baron, LLP

(57) ABSTRACT

The present invention relates to an electrical leak detecting apparatus for an electric vehicle, which is capable of not only detecting an electrical leak generated when a vehicle body is connected to the maximum potential or minimum potential of a battery pack, but also detecting which portion of the battery pack the vehicle body is connected to when an electrical leak is generated through the connection of the vehicle body and an intermediate potential of the battery pack. The electrical leak detecting apparatus for an electric vehicle according to the present invention includes: first and second switches connected to each other in series between a maximum potential terminal and a minimum potential terminal; a detection resistor having one end connected to a common contact of the first and second switches; and first and second measured potential supply units which are connected to each other in parallel between the other end of the detection resistor and the vehicle body, and which selectively provide first and second measured potentials, of different potential, to the battery pack.

17 Claims, 13 Drawing Sheets

ELECTRICAL LEAK DETECTING APPARATUS FOR AN ELECTRIC VEHICLE

CROSS-REFERENCE TO RELATED PATENT APPLICATION

This application claims the benefit of Korean Patent Application No. 10-2008-0034108, filed on Apr. 14, 2008, 10-2008-0119085, filed on Nov. 27, 2008, 10-2009-0031418, filed on Apr. 10, 2009 and PCT/KR2009/001920, filed on Apr. 14, 2009 in the Korean Intellectual Property Office, the disclosure of which is incorporated herein in its entirety by reference.

BACKGROUND OF THE INVENTION

1. Field of the Invention

The present invention relates to an electrical leak detecting apparatus for an electric vehicle, and more particularly, to an electrical leak detecting apparatus for an electric vehicle, which is capable of not only detecting an electrical leak generated when a vehicle body is connected to the maximum potential or minimum potential of a battery pack, but also detecting which portion of the battery pack the vehicle body is connected to when an electrical leak is generated through the connection of the vehicle body and an intermediate potential of the battery pack.

2. Description of the Related Art

Electric vehicles use a high voltage of about 1000 V as a driving source. Thus, a battery pack that is a driving source of an electric vehicle is separated from a vehicle body and should be maintained in an insulating state from the vehicle body.

However, when an electrical leak is generated when the vehicle body is connected to the battery pack of the electric vehicle due to an accident, an unknown cause or the like, a human life as well as the damage of the electric vehicle may be lost due to a high voltage of the battery pack.

Thus, the electric vehicle includes an essential element, such as an electrical leak detecting apparatus for detecting an electrical leak generated when the vehicle body is connected to the battery pack.

FIG. 1 is a conventional electrical leak detecting apparatus for an electric vehicle 120.

The conventional electrical leak detecting apparatus for the electric vehicle 120 illustrated in FIG. 1 is connected between a battery pack 110 and a vehicle body GND and detects an electrical leak generated when the vehicle body GND is connected to the battery pack 110. The conventional electrical leak detecting apparatus for the electric vehicle 120 illustrated in FIG. 1 equalizes a resistor between the electric pack 110 and the vehicle body GND and expresses the equalized resistor as an insulation resistor Rf. When the battery pack 110 and the vehicle body GND are normally maintained in an insulating state, the resistance value of the insulation resistor Rf is infinity, and current is cut off and does not flow through the conventional electrical leak detecting apparatus for the electric vehicle 120. However, when an abnormality occurs in the battery pack 110 and an electrical leak is generated in the vehicle body GND, the resistance value of the insulation resistor Rf is decreased. Thus, a closed circuit is formed between the battery pack 110, the insulation resistor Rf, the conventional electrical leak detecting apparatus for the electric vehicle 120, and the vehicle body GND, respectively, so that current flows through the conventional electrical leak detecting apparatus for the electric vehicle 120. The conventional electrical leak detecting apparatus for the electric vehicle 120 detects an electrical leak between the battery pack 110 and the vehicle body GND by using this principle. In FIG. 1, L is a load that uses a power of the battery pack 110.

The conventional electrical leak detecting apparatus for the electric vehicle 120 includes a voltage distribution resistor $R_s$, a detection resistor $R_m$, and a measured potential supply unit $V_{dc}$, which are connected to one another in series between a minimum potential terminal of the battery pack 110 and the vehicle body GND. The conventional electrical leak detecting apparatus for the electric vehicle 120 further includes first and second polarity conversion switches SW3 and SW4 between the detection resistor $R_m$ and the measured potential supply unit $V_{dc}$. In this regard, the first and second polarity conversion switches SW3 and SW4 are connected to each other and convert the polarity of the measured potential supply unit $V_{dc}$ connected between the battery pack 110 and the vehicle body GND. In other words, when the first and second polarity conversion switches SW3 and SW4 are connected to an a-point, a positive electrode of the measured potential supply unit $V_{dc}$ is connected to the detection resistor $R_m$. Also, a negative electrode of the measured potential supply unit $V_{dc}$ is connected to the vehicle body GND, and the battery pack 110 and the measured potential supply unit $V_{dc}$ are connected to each other in a forward direction. When the first and second polarity conversion switches SW3 and SW4 are connected to a b-point, the negative electrode of the measured potential supply unit $V_{dc}$ is connected to the detection resistor $R_m$. Also, the positive electrode of the measured potential supply unit $V_{dc}$ is connected to the vehicle body GND, and the battery pack 110 and the measured potential supply unit $V_{dc}$ are connected in a backward direction.

The operation of the conventional electrical leak detecting apparatus for the electric vehicle 120 will now be described with reference to FIG. 2.

Hereinafter, the conventional electrical leak detecting apparatus for the electric vehicle 120 when an electrical leak is generated when the vehicle body GND is connected to the maximum potential terminal of the battery pack 110 will be described. The conventional electrical leak detecting apparatus for the electric vehicle 120 equalizes a resistor between the maximum potential terminal of the battery pack 110 and the vehicle body GND and expresses the equalized resistor as a maximum potential insulation resistor $Rf_1$. When an electrical leak is generated when the vehicle body GND is connected to the maximum potential terminal of the battery pack 110, current flows through the conventional electrical leak detecting apparatus for the electric vehicle 120 via the maximum potential insulation resistor $Rf_1$. In this regard, when the first and second polarity conversion switches SW3 and SW4 are connected to the a-point as illustrated in FIG. 2, a closed circuit is formed between the battery pack 110, the maximum potential insulation resistor $Rf_1$, the measured potential supply unit $V_{dc}$ connected to the battery pack 110 in the forward direction, the detection resistor $R_m$, and the voltage distribution resistor $R_s$, respectively, so that current flows through the conventional electrical leak detecting apparatus for the electric vehicle 120, as illustrated in FIG. 3. The conventional electrical leak detecting apparatus for the electric vehicle 120 measures a both terminal voltage $V_m$ of the detection resistor $R_m$ to calculate a value of the maximum potential insulation resistor $Rf_1$, thereby detecting an electrical leak of the electric vehicle.

In this regard, the both terminal voltage $V_m$ of the detection resistor $R_m$ measured by the conventional electrical leak detecting apparatus for the electric vehicle 120 may be expressed using Equation 1. Here, a voltage of the battery pack 110 is expressed in Equation 1 and the following Equations as $(V_1+V_2)$ for better understanding, and the voltage of the battery pack 110 is not limited to $(V_1+V_2)$:

$$V_{m^+} = \frac{R_m}{R_s + R_m + Rf_1}(V_1 + V_2 + V_{dc}).\quad\text{Equation 1}$$

As shown in Equation 1, the value of the maximum potential insulation resistor $Rf_1$ may be obtained by obtaining $(V_1+V_2)$ that is the voltage of the battery pack 110. If the expression of the both terminal voltage $V_m$ is obtained using only the measured potential supply unit $V_{dc}$ without being affected by $(V_1+V_2)$ that is the voltage of the battery pack 110, the following operation should be further performed.

In detail, the first and second polarity conversion switches SW3 and SW4 of the conventional electrical leak detecting apparatus for the electric vehicle 120 are respectively connected to the b-point, as illustrated in FIG. 4. Then, a closed circuit is formed between the battery pack 110, the maximum potential insulation resistor $Rf_1$, the measured potential supply unit $V_{dc}$ connected to the battery pack 110 in the backward direction, the detection resistor $R_m$, and the voltage distribution resistor $R_s$, respectively, so that current flows through the conventional electrical leak detecting apparatus for the electric vehicle 120, as illustrated in FIG. 5. In this regard, the voltage $V_m$ as shown in Equation 2 is detected from the detection resistor $R_m$:

$$V_{m^-} = \frac{R_m}{R_s + R_m + Rf_1}(V_1 + V_2 + V_{dc}).\quad\text{Equation 2}$$

As known from Equations 1 and 2, when an electrical leak is generated when the vehicle body GND is connected to the maximum potential terminal of the battery pack 110, the voltage $V_m$ applied to both terminals of the detection resistor $R_m$ is the sum $(V_1+V_2)$ of voltages of the battery pack 110 and is comparatively high voltage. Thus, the conventional electrical leak detecting apparatus for the electric vehicle 120 may measure the both terminal voltage $V_m$ easily and precisely.

When Equation 2 is subtracted from Equation 1 and the result of subtraction is divided by 2, the voltage $V_m$ applied to the detection resistor $R_m$ is expressed using Equation 3:

$$V_m = \frac{R_m}{R_s + R_m + Rf_1}(V_{dc}).$$

The value of the maximum potential insulation resistor $Rf_1$ equalized by Equation 3 may be obtained using Equation 4. Thus, the conventional electrical leak detecting apparatus for the electric vehicle 120 may determine an electrical leak by using the resistance value of the equalized maximum potential insulation resistor $Rf_1$:

$$Rf_1 = \frac{R_m}{V_m}(V_{dc}) - (R_s + R_m).\quad\text{Equation 4}$$

Hereinafter, the conventional electrical leak detecting apparatus for the electric vehicle 120 when an electrical leak is generated when the vehicle body GND is connected to the minimum potential terminal of the battery pack 10 will be described. The conventional electrical leak detecting apparatus for the electric vehicle 120 equalizes a resistor between the minimum potential terminal of the battery pack 110 and the vehicle body GND and expresses the equalized resistor as a minimum potential insulation resistor $Rf_2$. When an electrical leak is generated when the vehicle body GND is connected to the minimum potential terminal of the battery pack 110, current flows through the conventional electrical leak detecting apparatus for the electric vehicle 120 via the equalized minimum potential insulation resistor $Rf_2$. In this regard, when the first and second polarity conversion switches SW3 and SW4 are connected to the a-point as illustrated in FIG. 6, a closed circuit is formed between the voltage distribution resistor $R_s$, the detection resistor $R_m$, the measured potential supply unit $V_{dc}$ connected to the detection resistor $R_m$ in a forward direction, and the minimum potential insulation resistor $Rf_2$, respectively, so that current flows through the conventional electrical leak detecting apparatus for the electric vehicle 120, as illustrated in FIG. 7. The conventional electrical leak detecting apparatus for the electric vehicle 120 measures the both terminal voltage $V_m$ of the detection resistor $R_m$ to calculate a value of the minimum potential insulation resistor $Rf_2$, thereby detecting an electrical leak of the electric vehicle. In this regard, the both terminal voltage $V_m$ of the detection resistor $R_m$ measured by the conventional electrical leak detecting apparatus for the electric vehicle 120 may be expressed using Equation 5:

$$V_{m^+} = \frac{R_m}{R_s + R_m + Rf_2}(+V_{dc}).\quad\text{Equation 5}$$

Obviously, when the first and second polarity conversion switches SW3 and SW4 are respectively connected to the b-point as illustrated in FIG. 8, a closed circuit is formed between the voltage distribution resistor $R_s$, the detection resistor $R_m$, the measured potential supply unit $V_{dc}$ connected to the detection resistor $R_m$ in a backward direction, and the minimum potential insulation resistor $Rf_2$, respectively, so that current flows through the conventional electrical leak detecting apparatus for the electric vehicle 120. In this regard, the both terminal voltage $V_m$ as shown in Equation 6 is measured from the detection resistor $R_m$:

$$V_{m^-} = \frac{R_m}{R_s + R_m + Rf_2}(-V_{dc}).\quad\text{Equation 6}$$

The both terminal voltage $V_m$ measured by the conventional electrical leak detecting apparatus for the electric vehicle 120 may be expressed using Equation 7 by subtracting Equation 6 from Equation 5 and by dividing the result of subtraction by 2. The value of the minimum potential insulation resistor $Rf_2$ equalized by Equation 7 may be calculated using Equation 8. The conventional electrical leak detecting apparatus for the electric vehicle 120 may determine an electrical leak by using the value of the equalized minimum potential insulation resistor $Rf_2$:

$$V_m = \frac{R_m}{R_s + R_m + Rf_2}(V_{dc}),\quad\text{Equation 7}$$

$$Rf_2 = \frac{R_m}{V_m}(V_{dc}) - (R_s + R_m).\quad\text{Equation 8}$$

In this regard, as known from Equations 5 and 6, when an electrical leak is generated when the vehicle body GND is connected to the minimum potential terminal of the battery pack 110, the voltage $V_m$ applied to both terminals of the detection resistor $R_m$ is obtained only from the measured potential supply unit $V_{dc}$. The measured potential supply unit $V_{dc}$ is much smaller than the voltage of the battery pack 110. Thus, it is very difficult to precisely measure the both terminal voltage $V_m$ of the detection resistor $R_m$ by using the conventional electrical leak detecting apparatus for the electric vehicle 120 due to low detection sensitivity. Thus, it is very difficult to determine an electrical leak.

Also, the conventional electrical leak detecting apparatus for the electric vehicle 120 detects an electrical leak by using the same method and the same Equation regardless of an electrical leak generated when the vehicle body GND is connected to the maximum potential terminal of the battery pack 110, an electrical leak generated when the vehicle body GND is connected to the minimum potential terminal of the battery pack 110, or an electrical leak generated when the vehicle body GND is connected to an intermediate potential of the battery pack 110. Then, the conventional electrical leak detecting apparatus for the electric vehicle 120 may determine an electrical leak of the battery pack 110 but may not precisely detect a place where an electrical leak is generated.

SUMMARY OF THE INVENTION

The present invention provides an electrical leak detecting apparatus for an electric vehicle, which is capable of not only easily detecting an electrical leak generated when a vehicle body is connected to a battery pack, regardless of a place of the battery pack where the electrical leak is generated, but also detecting the place of the battery pack where the electrical leak is generated.

According to an aspect of the present invention, there is provided an electrical leak detecting apparatus for an electric vehicle, the apparatus including: a first switch and a second switch connected to each other in series between a maximum potential terminal and a minimum potential terminal of a battery pack; a detection resistor having one end connected to a common contact of the first and second switches; and a measured potential supply unit connected between the other end of the detection resistor and a vehicle body and providing a potential to the battery pack.

The apparatus may further include: a third switch connected between the other end of the detection resistor and the vehicle body and providing the measured potential to the battery pack or cutting off the measured potential from the battery pack; and a fourth switch connected to the third switch in parallel between the other end of the detection resistor and the vehicle body.

The apparatus may further include: a third switch connected between the other end of the detection resistor and the vehicle body; and a fourth switch connected to the third switch in parallel between the other end of the detection resistor and the vehicle body and providing the measured potential to the battery pack or cutting off the measured potential from the battery pack.

One of the first switch and the second switch may be turned on and the other one may be turned off, and the measured potential may be provided to the battery pack, and a both terminal voltage of the detection resistor may be measured in such a way that whether an electrical leak is generated when the battery pack is connected to the vehicle body is able to be detected and a place where the electrical leak is generated is able to be detected.

According to another aspect of the present invention, there is provided an electrical leak detecting apparatus for an electric vehicle, the apparatus including: a first switch and a second switch connected to each other in series between a maximum potential terminal and a minimum potential terminal of a battery pack; a detection resistor having one end connected to a common contact of the first and second switches; and a first measured potential supply unit and a second measured potential supply unit providing first and second measured potentials, of different potential, to the battery pack, wherein the first measured potential supply unit or the second measured potential supply unit is connected between the other end of the detection resistor and a vehicle body in parallel, and one of the first measured potential and the second measured potential is provided to the battery pack.

The first measured potential and the second measured potential may have the same voltage values and opposite polarities.

The apparatus may further include a third switch providing the first measured potential to the battery pack or cutting off the first measured potential from the battery pack.

The apparatus may further include a fourth switch providing the second measured potential to the battery pack or cutting off the first measured potential from the battery pack.

One of the first switch and the second switch may be turned on and the other one may be turned off, and one of the first measured potential and the second measured potential may be provided to the battery pack, and a both terminal voltage of the detection resistor may be measured in such a way that whether an electrical leak is generated when the battery pack is connected to the vehicle body is able to be detected and a place where the electrical leak is generated is able to be detected.

The apparatus may further include a voltage distribution resistor connected between a maximum potential terminal of the battery pack and the detection resistor.

The apparatus may further include a voltage distribution resistor connected between a minimum potential terminal of the battery pack and the detection resistor.

According to another aspect of the present invention, there is provided an electrical leak detecting apparatus for an electric vehicle, the apparatus including: a first switch element connected to a positive electrode of a battery pack in parallel; a second switch element not only connected to a negative electrode of the battery pack in parallel but also connected to the first switch element in series; a voltage distribution resistor connected to the first and second switch elements in series; a detection resistor connected between the voltage distribution resistor and a measured potential supply unit in series; the measured potential supply unit and a vehicle body connected to the detection resistor in series; and a ground switch connected between the detection resistor and the vehicle body and grounding the detection resistor and the vehicle body.

The apparatus may further include first and second polarity conversion switches connecting the measured potential supply unit to the detection resistor and the vehicle body in series.

The measured potential supply unit may include first and second measured potential supply units which are separated from each other.

The apparatus may further include: a first measured potential supply unit connection switch connecting a positive electrode of the first measured potential supply unit to the detection resistor and connecting a negative electrode of the first measured potential supply unit to the vehicle body; and a second measured potential supply unit connection switch connecting a negative electrode of the second measured potential supply unit to the detection resistor and connecting a positive electrode of the second measured potential supply unit to the vehicle body.

According to another aspect of the present invention, there is provided a method of detecting an electrical leak for an electric vehicle, the method including: detecting a first voltage of a detection resistor when first and second polarity conversion switches are turned on with a first polarity, a first switch is turned off, a second switch is turned on and a ground switch is turned off; detecting a second voltage of the detection resistor by turning on the ground switch; obtaining a third voltage of the detection resistor by using a measured potential supply unit by subtracting the second voltage of the detection resistor from the first voltage of the detection resistor; detecting a fourth voltage of the detection resistor when the first and second polarity conversion switches are turned on with a second polarity, the first switch is turned on, the second switch is turned off and the ground switch is turned off; detecting a fifth voltage of the detection resistor by turning on the ground switch; obtaining a sixth voltage of the detection resistor by using the measured potential supply unit by subtracting the fifth voltage of the detection resistor from the fourth voltage of the detection resistor; and if the third voltage of the detection resistor is detected, determining maximum potential insulation failure, if the sixth voltage of the detection resistor is detected, determining minimum potential insulation failure, and if both the third voltage and the sixth voltage of the detection resistor are detected as insulation failure, determining intermediate potential insulation failure.

If both the third voltage and the sixth voltage of the detection resistor are detected and intermediate potential insulation failure is determined, which portion of the battery pack insulation failure is generated may be detected by comparing the first voltage of the detection resistor with the fourth voltage of the detection resistor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
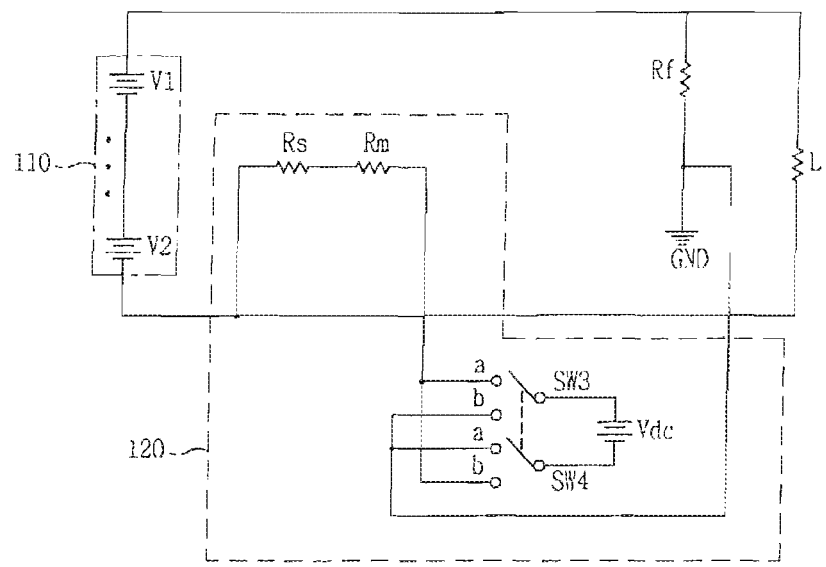
FIG. 1 illustrates a conventional electrical leak detecting apparatus for an electric vehicle.
Figure 2:
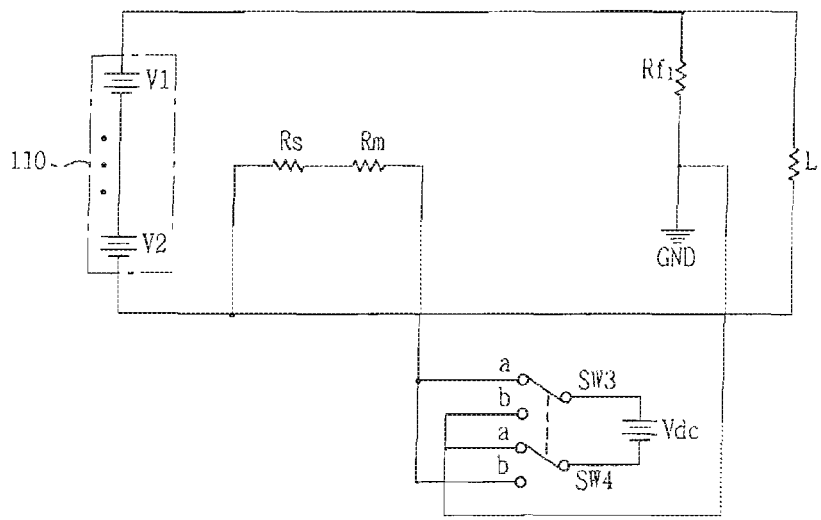
FIGS. 2 through 9 illustrate an operation of the conventional electrical leak detecting apparatus for an electric vehicle illustrated in FIG. 1.
Figure 3:
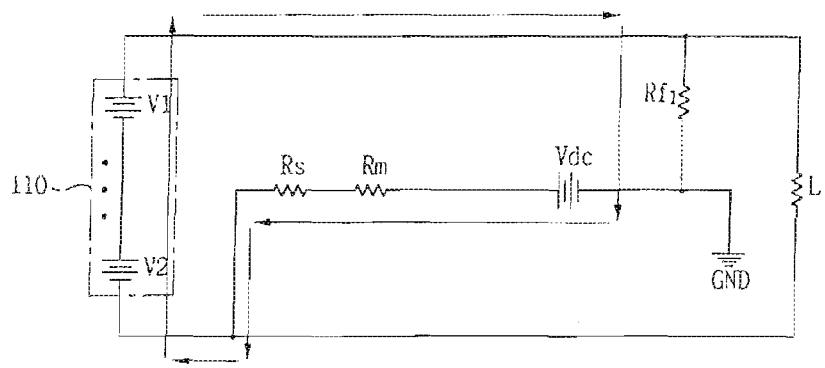
Figure 4:
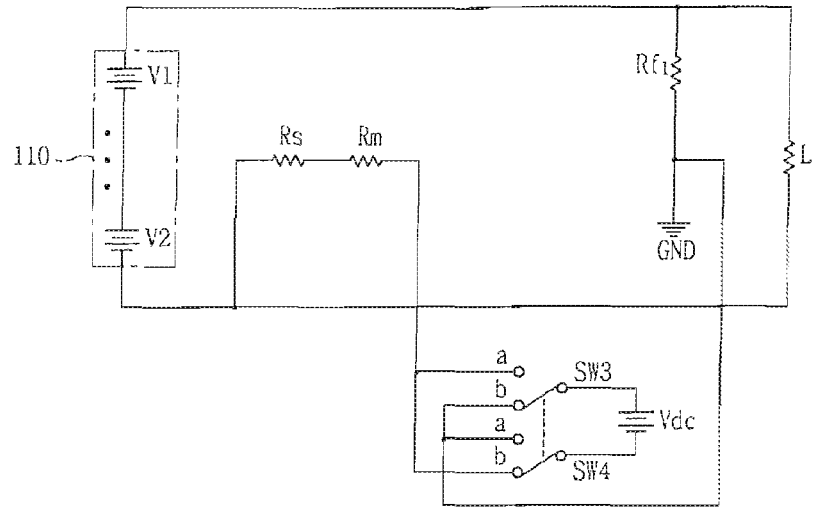
Figure 5:
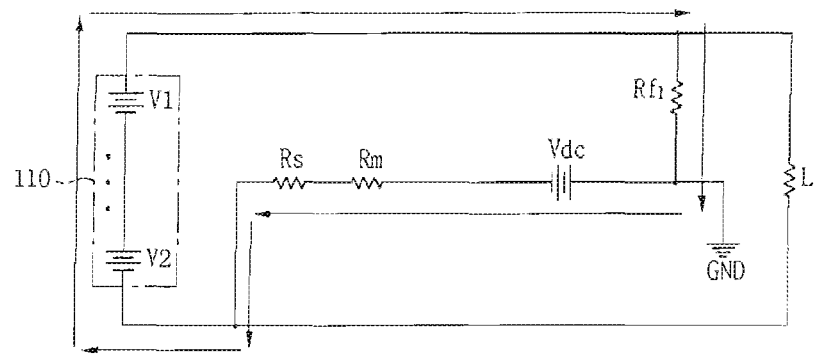
Figure 6:
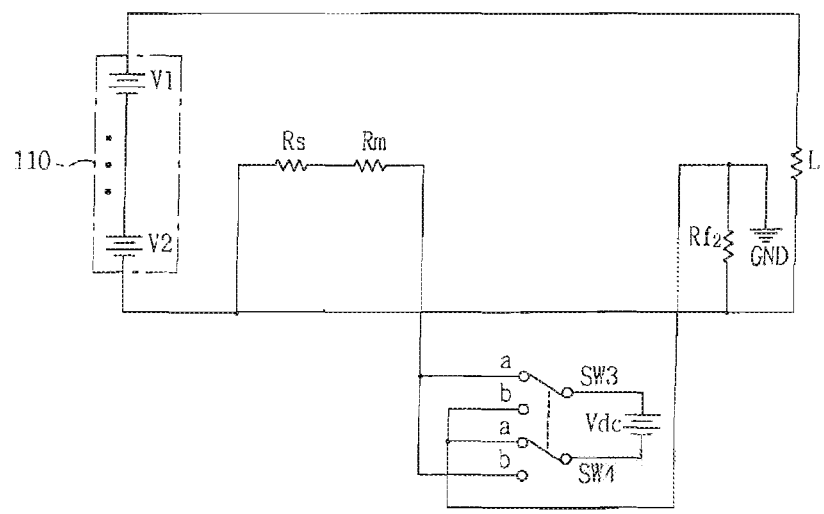
Figure 7:
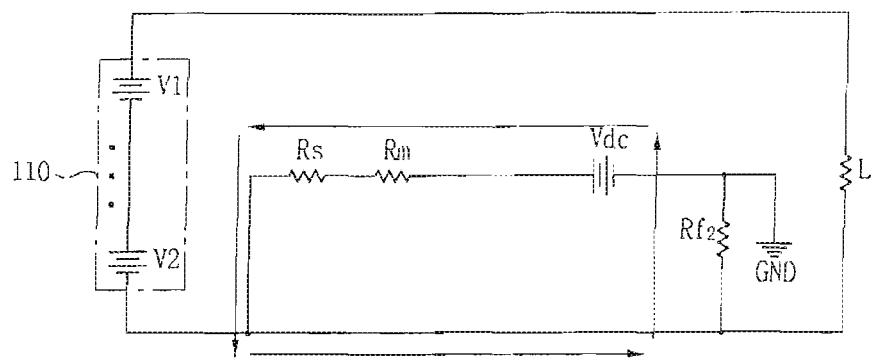
Figure 8:
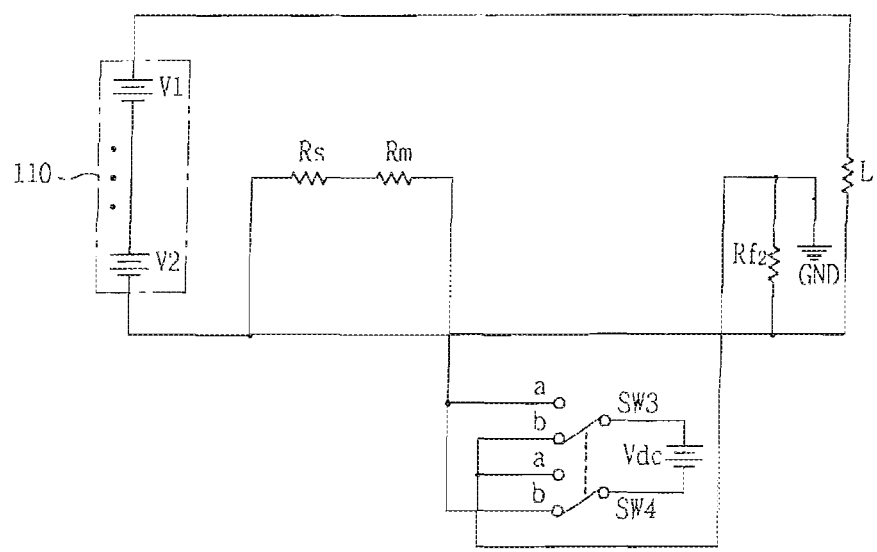
Figure 9:
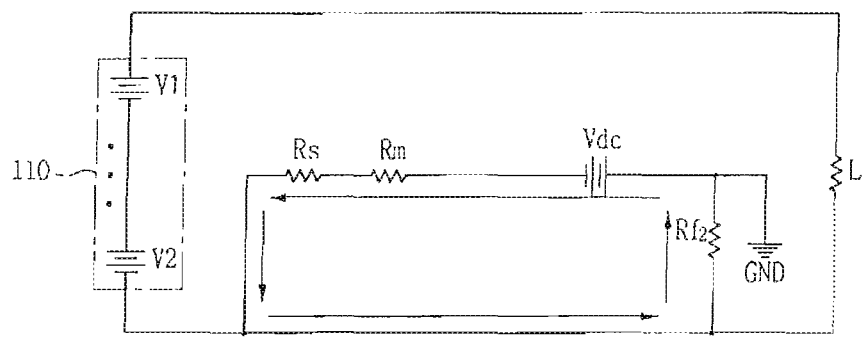

Hereinafter, the most preferred embodiments of the present invention will be described with reference to the attached drawings in order for one of ordinary skill in the art to easily implement the technical spirit of the present invention. First, it should be noted that, when reference numerals are added to elements of the drawings, like reference numerals denote like elements as possible although like elements are shown in other drawings. Also, in describing the present invention, when it is considered that a detailed description of a related well-known structure or function may make the point of the present invention ambiguous, the detailed description will not be provided here.

First Embodiment

Figure 10:
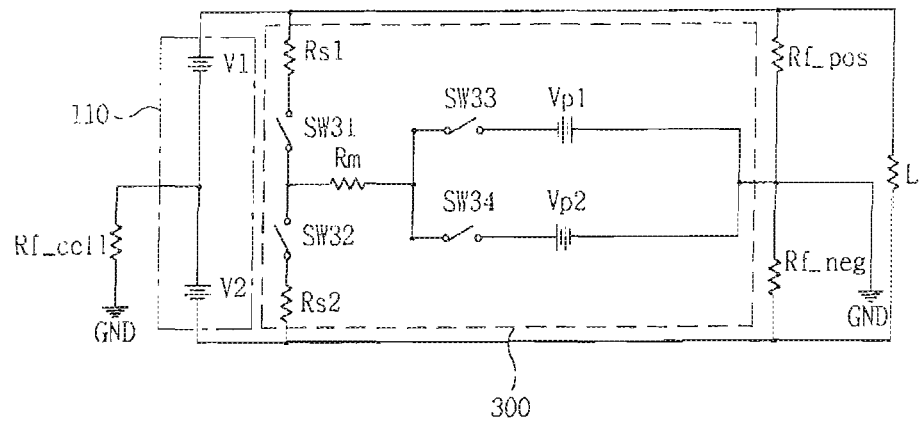
FIG. 10 illustrates an electrical leak detecting apparatus for an electric vehicle, according to an embodiment of the present invention.

Hereinafter, an electrical leak detecting apparatus for an electric vehicle, according to a first embodiment of the present invention will be described with reference to the attached drawings in detail. FIG. 10 illustrates an electrical leak detecting apparatus for an electric vehicle 300, according to the first embodiment of the present invention.

Referring to FIG. 10, the electrical leak detecting apparatus for an electric vehicle 300, according to the current embodiment is connected between a battery pack 110 and a vehicle body GND and detects whether an electrical leak is generated when the vehicle body GND is connected to the battery pack 110. The electrical leak detecting apparatus for an electric vehicle 300 equalizes a resistor between the maximum potential terminal of the battery pack 110 and the vehicle body GND and expresses the equalized resistor as a maximum potential insulation resistor $Rf_{\_pos}$. The electrical leak detecting apparatus for an electric vehicle 300 equalizes a resistor between the minimum potential terminal of the battery pack 110 and the vehicle body GND and expresses the equalized resistor as a minimum potential insulation resistor $Rf_{\_neg}$. The electrical leak detecting apparatus for an electric vehicle 300 equalizes a resistor between an intermediate potential of the battery pack 110 and the vehicle body GND and expresses the equalized resistor as an intermediate potential insulation resistor $Rf_{\_cell}$. When the battery pack 110 and the vehicle body GND are normally maintained in an insulating state, the resistance value of each of the insulation resistors $Rf_{\_pos}$, $Rf_{\_neg}$, and $Rf_{\_cell}$ is infinity, and current is cut off. However, in the electrical leak detecting apparatus for an electric vehicle 300, when an abnormality occurs in the battery pack 110 and an electrical leak is generated when the vehicle body GND is connected to the battery pack 110, the resistance value of each of the insulation resistors $Rf_{\_pos}$, $Rf_{\_neg}$, and $Rf_{\_cell}$ is decreased, and a closed circuit is generated between the battery pack 110, the corresponding insulation resistor, the electrical leak detecting apparatus for an electric vehicle 300, and the vehicle body GND. Thus, current flows through the electrical leak detecting apparatus for an electric vehicle 300. The present invention detects an electrical leak of the battery pack 110 and the vehicle body GND by using this principle.

The electrical leak detecting apparatus for an electric vehicle 300 includes a first voltage distribution resistor $Rs_1$ connected to the battery pack 110 in parallel, a first switch SW31, a second switch SW32, a second voltage distribution resistor Rs$_2$, a detection resistor R$_m$ having one end connected to a common contact of the first and second switches SW31 and SW32, a first measured potential supply unit Vp1 having a negative electrode connected to the other end of the detection resistor Rm and a positive electrode connected to the vehicle body GND, a second measured potential supply unit Vp2 having a positive electrode connected to the other end of the detection resistor R$_m$ and a negative electrode connected to the vehicle body GND, a third switch SW33 that provides a switching function between the detection resistor R$_m$ and the first measured potential supply unit Vp1, and a fourth switch SW34 that provides a switching function between the detection resistor R$_m$ and the second measured potential supply unit Vp2.

In the electrical leak detecting apparatus for an electric vehicle 300, instead of the first voltage distribution resistor Rs$_1$ and the second voltage distribution resistor Rs$_2$, one voltage distribution resistor R$_s$ may be connected between the common contact of the first and second switches SW31 and SW32 and the detection resistor R$_m$. In the current embodiment, resistance values of the first voltage distribution resistor Rs$_1$ and the second voltage distribution resistor Rs$_2$ are the same, Rs, i.e., Rs$_1$=Rs$_2$=Rs. The third switch SW33 is connected to provide a switching function between the first measured potential supply unit Vp1 and the detection resistor R$_m$. The fourth switch SW34 is connected to provide a switching function between the second measured potential supply unit Vp2 and the detection resistor R$_m$. Obviously, an additional switch may be connected to the positive and negative electrodes of the first measured potential supply unit Vp1, and an additional switch may be connected to the positive and negative electrodes of the second measured potential supply unit Vp2. Voltages of the first measured potential supply unit Vp1 and the second measured potential supply unit Vp2 are the same as a measured potential supply unit Vp, and only polarities thereof are connected reversely.

Hereinafter, the operation of the electrical leak detecting apparatus for an electric vehicle 300, according to the first embodiment of the present invention will be described with reference to the attached drawings in detail. FIGS. 11 through 16 illustrate an operation of the electrical leak detecting apparatus for an electric vehicle 300 illustrated in FIG. 10.

Figure 11:
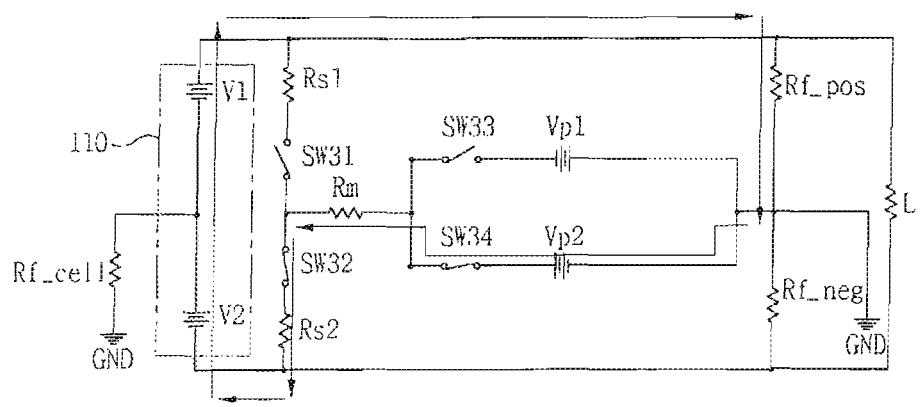
FIGS. 11 through 16 illustrate an operation of the electrical leak detecting apparatus for an electric vehicle illustrated in FIG. 10.

First, the electrical leak detecting apparatus for an electric vehicle 300 when an electrical leak is generated when the vehicle body GND is connected to the maximum potential terminal of the battery pack 110, will be described. When the electrical leak is generated when the vehicle body GND is connected to the maximum potential terminal of the battery pack 110, current flows through the electrical leak detecting apparatus for an electric vehicle 300 via the maximum potential insulation resistor Rf$_{-pos}$. In this regard, when the second switch SW32 and the fourth switch SW34 are turned on and the first switch SW31 and the third switch SW33 are turned off, in the electrical leak detecting apparatus for an electric vehicle 300, the second measured potential supply unit Vp2 is connected to the battery pack 110 in a forward direction, as illustrated in FIG. 11. A closed circuit is formed between the battery pack 110, the maximum potential insulation resistor Rf$_{-pos}$, the second measured potential supply unit Vp2, the fourth switch SW34, the detection resistor R$_m$, the second switch SW32, and the second voltage distribution resistor Rs$_2$, respectively, so that current flows through the electrical leak detecting apparatus for an electric vehicle 300. In this regard, the electrical leak detecting apparatus for an electric vehicle 300 measures the both terminal voltage V$_m$ of the detection resistor R$_m$. The both terminal voltage V$_m$ of the detection resistor R$_m$ measured by the electrical leak detecting apparatus for an electric vehicle 300 may be expressed using Equation 9:

$$V_{m^+} = \frac{R_m}{Rs_2 + R_m + Rf_{\_pos}}(V_1 + V_2 + Vp). \quad \text{Equation 9}$$

In the electrical leak detecting apparatus for an electric vehicle 300, a voltage (V$_1$+V$_2$) that is a voltage of the battery pack 110 should be obtained in order to obtain the value of the maximum potential insulation resistor Rf$_{-pos}$ by using Equation 9. In the electrical leak detecting apparatus for an electric vehicle 300, in order to obtain the value of the maximum potential insulation resistor Rf$_{-pos}$ by using only a measured potential supply unit Vp without being affected by (V$_1$+V$_2$) that is a voltage of the battery pack 110, the expression of the both terminal voltage V$_m$ is obtained by using only the measured potential supply unit Vp.

To this end, when the second switch SW32 and the third switch SW33 are turned on and the first switch SW31 and the fourth switch SW34 are turned off, the first measured potential supply unit Vp1 is connected to the battery pack 110 in a backward direction, and a closed circuit between the battery pack 110, the maximum potential insulation resistor Rf$_{-pos}$, the first measured potential supply unit Vp1, the third switch SW33, the detection resistor Rm, the second switch SW32, and the second voltage distribution resistor Rs$_2$, respectively, so that current flows through the electrical leak detecting apparatus for an electric vehicle 300. In this regard, the both terminal voltage V$_m$ of the detection resistor R$_m$ measured by the electrical leak detecting apparatus for an electric vehicle 300 is expressed using Equation 10:

$$V_{m^-} = \frac{R_m}{Rs_2 + R_m + Rf_{\_pos}}(V_1 + V_2 - Vp). \quad \text{Equation 10}$$

When Equation 10 is subtracted from Equation 9 and the result of subtraction is divided by 2, the both terminal voltage V$_m$ of the detection resistor R$_m$ is expressed using Equation 11. In this regard, the value of the maximum potential insulation resistor Rf$_{-pos}$ may be obtained as shown in Equation 12 by using Equation 11:

$$V_m = \frac{R_m}{Rs_2 + R_m + Rf_{\_pos}}(Vp), \quad \text{Equation 11}$$

$$Rf_{\_pos} = \frac{R_m}{V_m}(Vp) - (Rs_2 + R_m). \quad \text{Equation 12}$$

In other words, the electrical leak detecting apparatus for an electric vehicle 300 measures the both terminal voltage V$_m$ of the detection resistor R$_m$ while turning on the second switch SW32 and sequentially turning on the fourth switch SW34 and the third switch SW33, thereby obtaining a value of the equalized maximum potential insulation resistor Rf$_{-pos}$.

Also, when an electrical leak is generated when the vehicle body GND is connected to the maximum potential terminal of the battery pack 110 and the first switch SW1 is turned on and the second switch SW32 is turned off, a circuit is opened with respect to the voltage (V$_1$+V$_2$) of the battery pack 110 so that current hardly flows through the detection resistor R$_m$. Thus, the electrical leak detecting apparatus for an electric vehicle 300 may detect an electrical leak of the electronic vehicle and a place where the electrical leak is generated.

Also, in the electrical leak detecting apparatus for an electric vehicle 300, as shown in Equations 9 and 10, since, when an electrical leak is generated when the vehicle body GND is connected to the maximum potential terminal of the battery pack 110, the voltage ($V_1+V_2$) of the battery pack 110 is applied to the detection resistor $R_m$, a detection sensitivity of the electrical leak detecting apparatus for an electric vehicle 300 is improved so that the both terminal voltage $V_m$ of the detection resistor $R_m$ may be easily measured.

Figure 12:
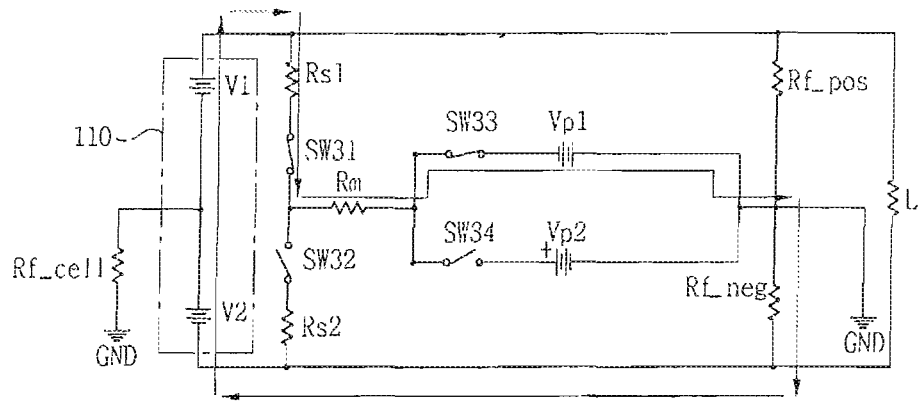

Next, the electrical leak detecting apparatus for an electric vehicle 300 when an electrical leak is generated when the vehicle body GND is connected to the minimum potential terminal of the battery pack 110, will be described. When the electrical leak is generated when the vehicle body GND is connected to the minimum potential terminal of the battery pack 110, current flows through the electrical leak detecting apparatus for an electric vehicle 300 via the minimum potential insulation resistor $Rf_{\_neg}$. In this regard, when the first switch SW31 and the third switch SW33 are turned on and the second switch SW32 and the fourth switch SW34 are turned off, in the electrical leak detecting apparatus for an electric vehicle 300, the first measured potential supply unit Vp1 is connected to the battery pack 110 in a forward direction, as illustrated in FIG. 12. Also, a closed circuit is formed between the battery pack 110, the first voltage distribution resistor $Rs_1$, the first switch SW31, the detection resistor $R_m$, the third switch SW33, the first measured potential supply unit Vp1, and the minimum potential insulation resistor $Rf_{\_neg}$, respectively, so that current flows through the electrical leak detecting apparatus for an electric vehicle 300. In this regard, the electrical leak detecting apparatus for an electric vehicle 300 measures the both terminal voltage $V_m$ of the detection resistor $R_m$. The both terminal voltage Vm of the detection resistor $R_m$ measured by the electrical leak detecting apparatus for an electric vehicle 300 may be expressed using Equation 13:

$$V_{m^+} = \frac{R_m}{Rs_1 + R_m + Rf_{\_neg}}(V_1 + V_2 + Vp). \quad \text{Equation 13}$$

In the electrical leak detecting apparatus for an electric vehicle 300, a voltage ($V_1+V_2$) that is a voltage of the battery pack 110 should be obtained in order to obtain the value of the minimum potential insulation resistor $Rf_{\_neg}$ by using Equation 13. In the electrical leak detecting apparatus for an electric vehicle 300, in order to obtain the value of the minimum potential insulation resistor $Rf_{\_neg}$ by using only the measured potential supply unit Vp without being affected by ($V_1+V_2$) that is the voltage of the battery pack 110, the expression of the both terminal voltage $V_m$ is obtained by using only the measured potential supply unit Vp.

To this end, when the first switch SW31 and the fourth switch SW34 are turned on and the second switch SW32 and the third switch SW33 are turned off, the second measured potential supply unit Vp2 is connected to the battery pack 110 in a backward direction. Also, a closed circuit between the battery pack 110, the first voltage distribution resistor $Rs_1$, the first switch SW31, the detection resistor $R_m$, the fourth switch SW34, the second measured potential supply unit Vp2, and the minimum potential insulation resistor $Rf_{\_neg}$, respectively, so that current flows through the electrical leak detecting apparatus for an electric vehicle 300. In this regard, the both terminal voltage $V_m$ of the detection resistor $R_m$ measured by the electrical leak detecting apparatus for an electric vehicle 300 is expressed using Equation 14:

$$V_{m^-} = \frac{R_m}{Rs_2 + R_m + Rf_{\_pos}}(V_1 + V_2 - Vp). \quad \text{Equation 14}$$

When Equation 14 is subtracted from Equation 13 and the result of subtraction is divided by 2, the both terminal voltage $V_m$ of the detection resistor $R_m$ measured by the electrical leak detecting apparatus for an electric vehicle 300 is expressed using Equation 15. In this regard, the value of the minimum potential insulation resistor $Rf_{\_neg}$ may be obtained as shown in Equation 16 by using Equation 15:

$$V_m = \frac{R_m}{Rs_2 + R_m + Rf_{\_pos}}(Vp), \quad \text{Equation 15}$$

$$Rf_{\_pos} = \frac{R_m}{V_m}(Vp) - (Rs_2 + R_m). \quad \text{Equation 16}$$

In other words, the electrical leak detecting apparatus for an electric vehicle 300 measures the both terminal voltage $V_m$ of the detection resistor $R_m$ while turning on the first switch SW31 and sequentially turning on the third switch SW33 and the fourth switch SW34, thereby obtaining a value of the equalized minimum potential insulation resistor $Rf_{\_neg}$.

Also, when an electrical leak is generated when the vehicle body GND is connected to the minimum potential terminal of the battery pack 110 and the second switch SW2 is turned on and the first switch SW31 is turned off, a circuit is opened with respect to the voltage ($V_1+V_2$) of the battery pack 110 so that current hardly flows through the detection resistor $R_m$. Thus, the electrical leak detecting apparatus for an electric vehicle 300 may detect an electrical leak of the electronic vehicle and a place where the electrical leak is generated.

Also, in the electrical leak detecting apparatus for an electric vehicle 300, as shown in Equations 13 and 14, since, when an electrical leak is generated when the vehicle body GND is connected to the minimum potential terminal of the battery pack 110, the voltage ($V_1+V_2$) of the battery pack 110 is applied to the detection resistor $R_m$, a detection sensitivity of the electrical leak detecting apparatus for an electric vehicle 300 is improved so that the both terminal voltage $V_m$ of the detection resistor $R_m$ may be easily measured.

Next, the electrical leak detecting apparatus for an electric vehicle 300 when an electrical leak is generated when the vehicle body GND is connected to the intermediate potential of the battery pack 110, will be described. When the electrical leak is generated when the vehicle body GND is connected to the intermediate potential of the battery pack 110, current flows through the electrical leak detecting apparatus for an electric vehicle 300 via the intermediate potential insulation resistor $Rf_{\_cell}$. In this regard, the electrical leak detecting apparatus for an electric vehicle 300 obtains a value of intermediate potential insulation resistor $Rf_{\_cell}$ in a state where the first switch SW1 is connected to the maximum potential terminal of the battery pack 110. Also, the electrical leak detecting apparatus for an electric vehicle 300 obtains a value of the intermediate potential insulation resistor $Rf_{\_cell}$ in a state where the second switch SW2 is connected to the minimum potential terminal of the battery pack 110. Subsequently, the electrical leak detecting apparatus for an electric vehicle 300 calculates a place where an electrical leak is generated, using the ratio of the values obtained in the two cases. This will be described later in detail.

(i) Obtaining the Value of the Intermediate Potential Insulation Resistor $Rf_{\_cell}$ by Connecting the Second Switch SW32

Figure 13:
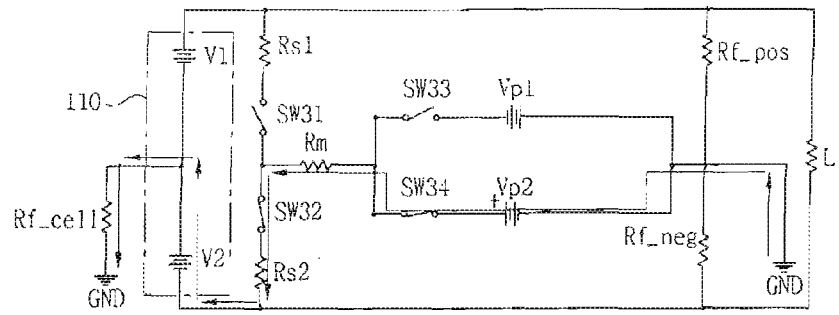

As illustrated in FIG. 13, when the second switch SW32 is connected and the fourth switch SW34 and the third switch SW33 are sequentially turned on, the electrical leak detecting apparatus for an electric vehicle 300 may obtain the value of the intermediate potential insulation resistor $Rf_{\_cell}$ in a similar way to obtaining the value of the maximum potential insulation resistor $Rf_{\_pos}$ described with reference to FIG. 11. In this regard, when the second switch SW32 and the fourth switch SW34 are turned on and the first switch SW31 and the third switch SW33 are turned off, the both terminal voltage $V_m$ of the detection resistor $R_m$ is expressed as shown in Equation 17. Also, when the second switch SW32 and the third switch SW33 are turned on and the first switch SW31 and the fourth switch SW34 are turned off, the both terminal voltage $V_m$ of the detection resistor $R_m$ is expressed as shown in Equation 18. When Equation 18 is subtracted from Equation 17 and the result of subtraction is divided by 2, the both terminal voltage $V_m$ of the detection resistor $R_m$ is expressed as shown in Equation 19 expressed using only the second measured potential supply unit Vp2. The value of the intermediate potential insulation resistor $Rf_{\_cell}$ may be obtained as shown in Equation 20 by using Equation 19:

$$V_{m^+} = \frac{R_m}{Rs_2 + R_m + Rf_{\_cell}}(V_2 + Vp), \quad \text{Equation 17}$$

$$V_{m^-} = \frac{R_m}{Rs_2 + R_m + Rf_{\_cell}}(V_2 - Vp), \quad \text{Equation 18}$$

$$V_m = \frac{R_m}{Rs_2 + R_m + Rf_{\_cell}}(Vp), \quad \text{Equation 19}$$

$$Rf_{\_cell} = \frac{R_m}{V_m}(Vp) - (Rs_2 + R_m). \quad \text{Equation 20}$$

(ii) Obtaining the Value of the of the Intermediate Potential Insulation Resistor $Rf_{\_cell}$ by Connecting the First Switch SW31

Figure 14:
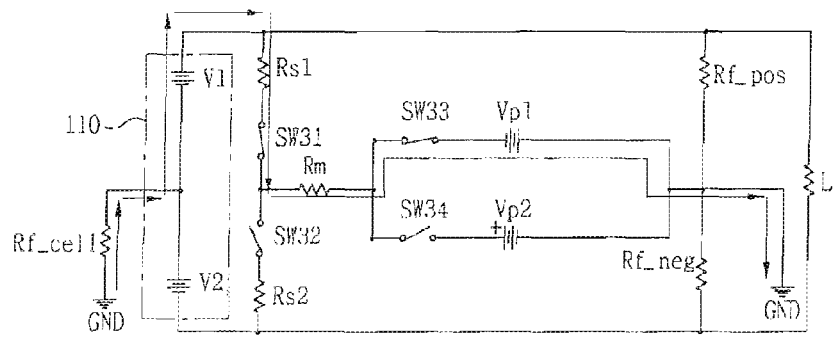

As illustrated in FIG. 14, when the first switch SW31 is connected and the third switch SW33 and the fourth switch SW34 are sequentially turned on, the electrical leak detecting apparatus for an electric vehicle 300 may obtain the value of the intermediate potential insulation resistor $Rf_{\_cell}$ in a similar way to obtaining the value of the minimum potential insulation resistor $Rf_{\_neg}$ described with reference to FIG. 12. In this regard, when the first switch SW31 and the third switch SW33 are turned on and the second switch SW32 and the fourth switch SW34 are turned off, the both terminal voltage $V_m$ of the detection resistor $R_m$ is expressed as shown in Equation 21. Also, when the first switch SW31 and the fourth switch SW34 are turned on and the second switch SW32 and the third switch SW33 are turned off, the both terminal voltage $V_m$ of the detection resistor $R_m$ is expressed as shown in Equation 22. When Equation 22 is subtracted from Equation 21 and the result of subtraction is divided by 2, the both terminal voltage $V_m$ of the detection resistor $R_m$ is expressed as shown in Equation 23 expressed using only the first measured potential supply unit Vp1. The value of the intermediate potential insulation resistor $Rf_{\_cell}$ may be obtained as shown in Equation 24 by using Equation 23:

$$V_{m^+} = \frac{R_m}{Rs_1 + R_m + Rf_{\_cell}}(V_1 + Vp), \quad \text{Equation 21}$$

$$V_{m^-} = \frac{R_m}{Rs_1 + R_m + Rf_{\_cell}}(V_1 - Vp), \quad \text{Equation 22}$$

$$V_{m^-} \frac{R_m}{Rs_1 + R_m + Rf_{\_cell}}(Vp), \quad \text{Equation 23}$$

$$Rf_{\_cell} = \frac{R_m}{V_m}(Vp) - (Rs_1 + R_m). \quad \text{Equation 24}$$

(iii) Obtaining a Place where an Electrical Leak is Generated when the Vehicle Body GND is Connected to the Intermediate Potential of the Battery Pack 110

As described above, in the electrical leak detecting apparatus for an electric vehicle 300, when an insulation failure is generated at an intermediate point of the battery pack 110, a closed circuit is formed regardless of whether the first switch SW31 is turned on and the second switch SW32 is turned off or whether the first switch SW31 is turned off and the second switch SW32 is turned on, so that current flows through the detection resistor $R_m$. In this case, the electrical leak detecting apparatus for an electric vehicle 300 may detect that an electrical leak is generated at the intermediate point of the battery pack 110. Furthermore, as shown in Equations 17 and 18 and Equations 21 and 22, the detection voltage $V_m$ of the detection resistor $R_m$ when the second switch SW32 is connected and the detection voltage $V_m$ of the detection resistor $R_m$ when the first switch SW31 is connected, are different from each other according to a place where an electrical leak is generated at the intermediate point of the battery pack 110. Thus, the electrical leak detecting apparatus for an electric vehicle 300 may detect a place where the electrical leak of the electric vehicle is generated, by using the ratio of the values obtained in the two cases.

Figure 15:
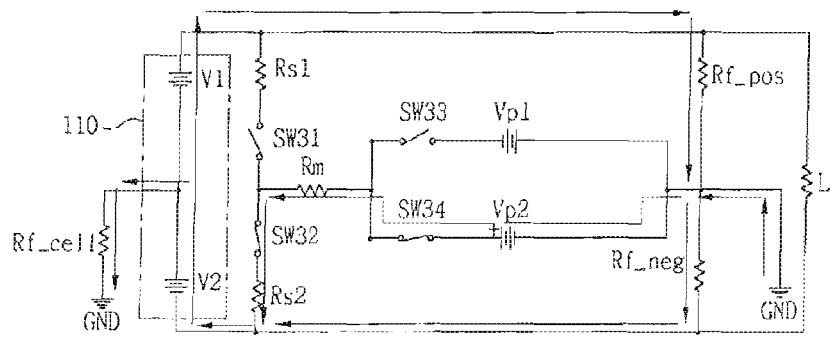
Figure 16:
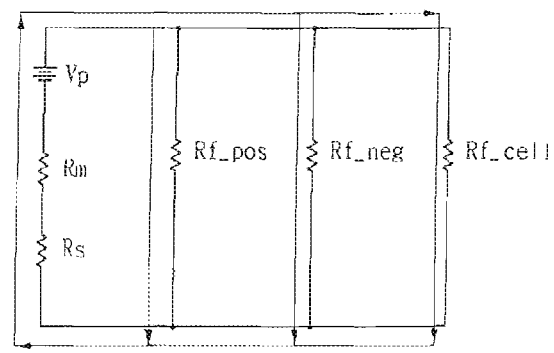

Next, the electrical leak detecting apparatus for an electric vehicle 300 when a complex electrical leak is generated in the battery pack 110 will be described. When an electrical leak is generated in two or more places among the maximum potential terminal, the minimum potential terminal, and the intermediate potential of the battery pack 110, current flows through the electrical leak detecting apparatus for an electric vehicle 300 via the corresponding maximum potential insulation resistor $Rf_{\_pos}$ the corresponding minimum potential insulation resistor $Rf_{\_neg}$, and the corresponding intermediate potential insulation resistor $Rf_{\_cell}$. When an electrical leak is generated at all of the maximum potential terminal, the minimum potential terminal, and the intermediate potential of the battery pack 100, the electrical leak detecting apparatus for an electric vehicle 300 turns on the second switch SW32 and the fourth switch SW34 connected to the minimum potential terminal of the battery pack 110 and turns off the first switch SW31 and the third switch SW33. Thus, current flows through the electrical leak detecting apparatus for an electric vehicle 300 via the maximum potential insulation resistor $Rf_{\_pos}$, the minimum potential insulation resistor $Rf_{\_neg}$, and the intermediate potential insulation resistor $Rf_{\_cell}$, as illustrated in FIG. 15. In this case, the electrical leak detecting apparatus for an electric vehicle 300 may detect the both terminal voltage $V_m$ of the detection resistor $R_m$. The electrical leak detecting apparatus for an electric vehicle 300 turns on the second switch SW32 and the third switch SW33 of the battery pack 110 and turns off the first switch SW31 and the fourth switch SW34 so as to remove the effect of $(V_1+V_2)$, like in the previous way. Thus, current flows through the electrical leak detecting apparatus for an electric vehicle 300 via the maximum potential insulation resistor $Rf_{\_pos}$, the minimum potential insulation resistor $Rf_{\_neg}$, and the intermediate potential insulation resistor $Rf_{\_cell}$, and the electrical leak detecting apparatus for an electric vehicle 300 may detect the both terminal voltage $V_m$ of the detection resistor $R_m$. The both terminal voltage $V_m$ of the detection resistor $R_m$ is expressed as shown in Equation 25 in which the voltage of the battery pack 110 is not included, by subtracting a voltage value detected at this time from a voltage value detected immediately before and by dividing the result of subtraction by 2. In this regard, the maximum potential insulation resistor $Rf_{\_pos}$, the minimum potential insulation resistor $Rf_{\_neg}$, and the intermediate potential insulation resistor $Rf_{\_cell}$ are connected to one another in parallel. An equivalent circuit of the electrical leak detecting apparatus for an electric vehicle 300 is as illustrated in FIG. 16.

$$V_m = \frac{R_m}{Rs_2 + R_m + Rf_{\_total}}(Vp), \qquad \text{Equation 25}$$

where a total potential insulation resistor $Rf_{\_total}$ is an equivalent circuit of the maximum potential insulation resistor $Rf_{\_pos}$, the minimum potential insulation resistor $Rf_{\_neg}$, and the intermediate potential insulation resistor $Rf_{\_cell}$, which are connected to one another in parallel.

Similarly, the electrical leak detecting apparatus for an electric vehicle 300 obtains a value of the total potential insulation resistor $Rf_{\_total}$ by turning on the first switch SW31 connected to the maximum potential terminal of the battery pack 110 and by expressing the both terminal voltage $V_m$ of the detection resistor $R_m$ as Equation in which the voltage of the battery pack 110 is not included. Thus, the electrical leak detecting apparatus for an electric vehicle 300 may detect a failure even when an electrical leak is generated from a complex point of the battery pack 110.

Second Embodiment

Figure 17:
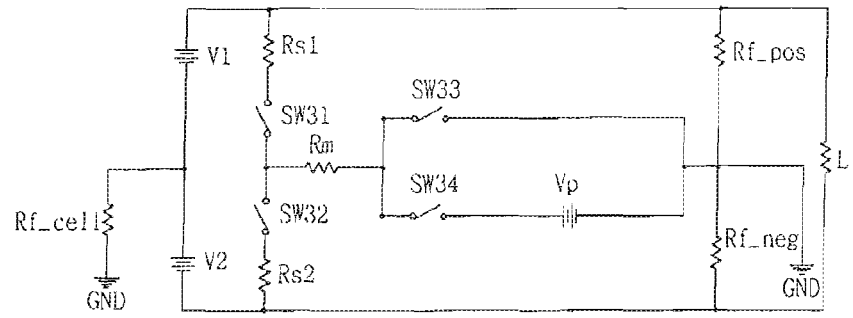
FIG. 17 illustrates an electrical leak detecting apparatus for an electric vehicle, according to another embodiment of the present invention.

Hereinafter, an electrical leak detecting apparatus for an electric vehicle, according to a second embodiment of the present invention will be described with reference to the attached drawings in detail. FIG. 17 illustrates an electrical leak detecting apparatus for an electric vehicle 300, according to the second embodiment of the present invention.

Referring to FIG. 17, the electrical leak detecting apparatus for an electric vehicle 300 is constituted by omitting the first measured potential supply unit Vp1 connected between the third switch SW33 and the vehicle body GND from the electrical leak detecting apparatus for an electric vehicle 300 illustrated in FIG. 10. In this way, even when the first measured potential supply unit Vp1 is omitted, the same effect as that of FIG. 10 is obtained, which will be described later.

When the Vehicle Body GND is Connected to the Maximum Potential terminal of the battery Pack 110

First, the both terminal $V_m$ of the detection resistor $R_m$ may be measured by turning on the second switch SW32 and the fourth switch SW34 and by turning off the first switch SW31 and the third switch SW33, and the measured voltage $V_m$ is expressed as Equation 26:

$$V_{m^+} = \frac{R_m}{Rs_2 + R_m + Rf_{\_pos}}(V_1 + V_2 + Vp). \qquad \text{Equation 26}$$

Next, the both terminal voltage $V_m$ of the detection resistor $R_m$ measured by turning on the second switch SW32 and the third switch SW33 and by turning off the first switch SW31 and the fourth switch SW34 is expressed as Equation 27:

$$V_{m^-} = \frac{R_m}{Rs_2 + R_m + Rf_{\_pos}}(V_1 + V_2). \qquad \text{Equation 27}$$

When Equation 27 is subtracted from Equation 26 so as to remove the effect of $(V_1+V_2)$ in Equations 26 and 27, the result of subtraction is expressed as Equation 28:

$$V_m = \frac{R_m}{Rs_2 + R_m + Rf_{\_pos}}(Vp). \qquad \text{Equation 28}$$

This is the same as Equation 11.

When the Vehicle Body GND is Connected to the Minimum Potential Terminal of the Battery Pack 110

The both terminal voltage $V_m$ of the detection resistor $R_m$ measured by turning on the first switch SW31 and the third switch SW33 and by turning off the second switch SW32 and the fourth switch SW34 is expressed as Equation 29:

$$V_{m^+} = \frac{R_m}{Rs_1 + R_m + Rf_{\_neg}}(V_1 + V_2). \qquad \text{Equation 29}$$

Next, the both terminal voltage $V_m$ of the detection resistor $R_m$ measured by turning on the first switch SW31 and the fourth switch SW34 and by turning off the second switch SW32 and the third switch SW33 is expressed as Equation 30:

$$V_{m^-} = \frac{R_m}{Rs_1 + R_m + Rf_{\_neg}}(V_1 + V_2 - Vp). \qquad \text{Equation 30}$$

When Equation 30 is subtracted from Equation 29 so as to remove the effect of $(V_1+VD)$ in Equations 29 and 30, the result of subtraction is expressed as Equation 31:

$$V_m = \frac{R_m}{Rs_1 + R_m + Rf_{\_neg}}(Vp). \qquad \text{Equation 31}$$

This is the same as Equation 15.

In FIG. 17, only the electrical leak detecting apparatus for an electric vehicle 300 from which the first measured potential supply unit Vp1 is omitted is illustrated. However, even when the second measured potential supply unit Vp2 connected between the fourth switch SW34 and the vehicle body GND, instead of the first measured potential supply unit Vp1 is omitted from the electrical leak detecting apparatus for an electric vehicle 300, the same effect as that when the first measured potential supply unit Vp1 is omitted from the electrical leak detecting apparatus for an electric vehicle 300 may be obtained.

Third Embodiment

Figure 18:
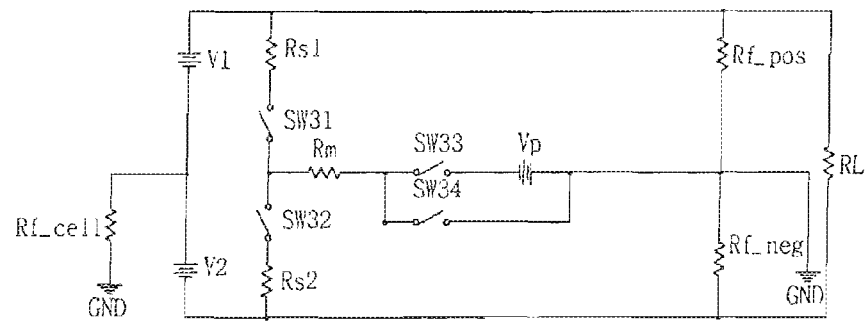
FIG. 18 illustrates an electrical leak detecting apparatus for an electric vehicle, according to another embodiment of the present invention.

Hereinafter, an electrical leak detecting apparatus for an electric vehicle, according to a third embodiment of the present invention will be described with reference to the attached drawings in detail. FIG. 18 illustrates an electrical leak detecting apparatus for an electric vehicle 300, according to the third embodiment of the present invention.

Referring to FIG. 18, the electrical leak detecting apparatus for an electric vehicle 300 is constituted by omitting the second measured potential supply unit Vp2 connected between the fourth switch SW34 and the vehicle body GND from the electrical leak detecting apparatus for an electric vehicle 300 illustrated in FIG. 10. In this way, even when the second measured potential supply unit Vp2 is omitted, the same effect as that of FIG. 10 is obtained, which will be described later.

Hereinafter, an operation of the electrical leak detecting apparatus for an electric vehicle 300, according to the third embodiment of the present invention will be described with reference to the attached drawings in detail. FIGS. 19 through 28 illustrate an operation of the electrical leak detecting apparatus for an electric vehicle 300 illustrated in FIG. 18.

Figure 19:
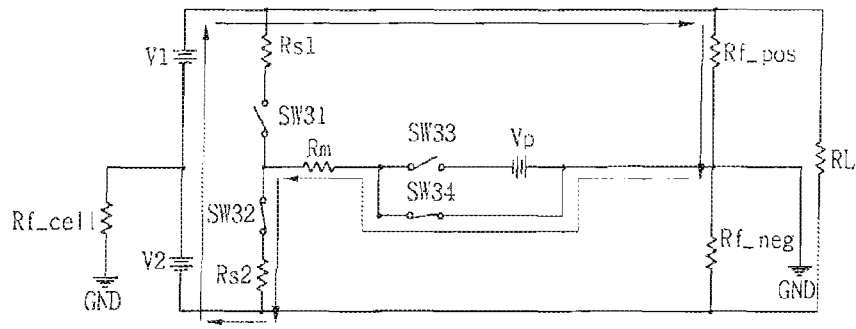
FIGS. 19 through 28 illustrate an operation of the electrical leak detecting apparatus for an electric vehicle illustrated in FIG. 18.
Figure 20:
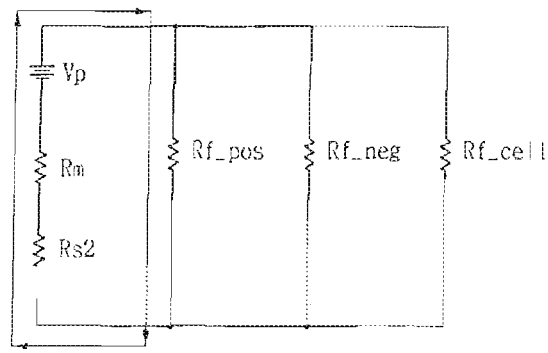

First, the electrical leak detecting apparatus for an electric vehicle 300 when an electrical leak is generated when the vehicle body GND is connected to the maximum potential terminal of the battery pack 110, will be described. When the electrical leak is generated when the vehicle body GND is connected to the maximum potential terminal of the battery pack 110, current flows through the electrical leak detecting apparatus for an electric vehicle 300 via the maximum potential insulation resistor $Rf_{\_pos}$. In this regard, the electrical leak detecting apparatus for an electric vehicle 300 turns on the second switch SW32 and the fourth switch SW34 and turns off the first switch SW31 and the third switch SW33. Thus, the electrical leak detecting apparatus for an electric vehicle 300 forms a closed circuit, as illustrated in FIG. 19. In detail, a closed circuit is formed between the battery pack 110, the maximum potential insulation resistor $Rf_{\_pos}$, the measured potential supply unit Vp, the fourth switch SW34, the detection resistor $R_m$, the second switch SW32, and the second voltage distribution resistor $Rs_2$, respectively. In this regard, a both terminal voltage $V_m$, i.e., a voltage caused by current that flows through the detection resistor $R_m$, measured by the electrical leak detecting apparatus for an electric vehicle 300 may be expressed as shown in the following Equation 32:

$$V_{m^+} = \frac{R_m}{Rs_2 + R_m + Rf_{\_pos}}(V_1 + V_2). \quad \text{Equation 32}$$

In the electrical leak detecting apparatus for an electric vehicle 300, a voltage $(V_1+V_2)$ that is a voltage of the battery pack 110 should be obtained in order to obtain the value of the maximum potential insulation resistor $Rf_{\_pos}$ by using Equation 32. In the electrical leak detecting apparatus for an electric vehicle 300, in order to obtain the value of the maximum potential insulation resistor $Rf_{\_pos}$ by using only a measured potential supply unit Vp without being affected by $(V_1+V_2)$ that is the voltage of the battery pack 110, the expression of the both terminal voltage $V_m$ is obtained by using only the measured potential supply unit Vp.

To this end, the electrical leak detecting apparatus for an electric vehicle 300 turns on the second switch SW32 and the third switch SW33 and turns off the first switch SW31 and the fourth switch SW34. In the electrical leak detecting apparatus for an electric vehicle 300, a closed circuit is formed between the battery pack 110, the maximum potential insulation resistor $Rf_{\_pos}$, the fourth switch SW34, the detection resistor $R_m$, the second switch SW32, and the second voltage distribution resistor $Rs_2$, respectively, so that current flows through the electrical leak detecting apparatus for an electric vehicle 300. In this regard, the both terminal voltage $V_m$ of the detection resistor $R_m$, measured by the electrical leak detecting apparatus for an electric vehicle 300 is expressed using Equation 33:

$$V_{m^-} = \frac{R_m}{Rs_2 + R_m + Rf_{\_pos}}(V_1 + V_2 - Vp). \quad \text{Equation 33}$$

When Equation 33 is subtracted from Equation 32 in order to obtain the expression of the both terminal voltage $V_m$ by using only the measured potential supply unit Vp, the both terminal voltage $V_m$ of the detection resistor $R_m$ is expressed using Equation 34. In this regard, the value of the maximum potential insulation resistor $Rf_{\_pos}$ is expressed as shown in Equation 35 by using Equation 34:

$$V_m = \frac{R_m}{Rs_2 + R_m + Rf_{\_pos}}(Vp), \quad \text{Equation 34}$$

$$Rf_{\_pos} = \frac{R_m}{V_m}(Vp) - (Rs_2 + R_m). \quad \text{Equation 35}$$

In other words, the electrical leak detecting apparatus for an electric vehicle 300 according to the third embodiment measures the both terminal voltage $V_m$ of the detection resistor $R_m$ while turning on the second switch SW32 and sequentially turning on the fourth switch SW34 and the third switch SW33, thereby obtaining a value of the equalized maximum potential insulation resistor $Rf_{\_pos}$.

Also, when an electrical leak is generated when the vehicle body GND is connected to the maximum potential terminal of the battery pack 110 and the first switch SW1 is turned on and the second switch SW32 is turned off, a circuit is opened with respect to the voltage $(V_1+V_2)$ of the battery pack 110 so that current hardly flows through the detection resistor $R_m$. Thus, the electrical leak detecting apparatus for an electric vehicle 300 may detect an electrical leak of the electronic vehicle and a place where the electrical leak is generated.

Also, in the electrical leak detecting apparatus for an electric vehicle 300, as shown in Equations 32 and 33, since, when an electrical leak is generated when the vehicle body GND is connected to the maximum potential terminal of the battery pack 110, the voltage $(V_1+V_2)$ of the battery pack 110 is applied to the detection resistor $R_m$, a detection sensitivity of the electrical leak detecting apparatus for an electric vehicle 300 is improved so that the both terminal voltage $V_m$ of the detection resistor $R_m$ may be easily measured.

Figure 21:
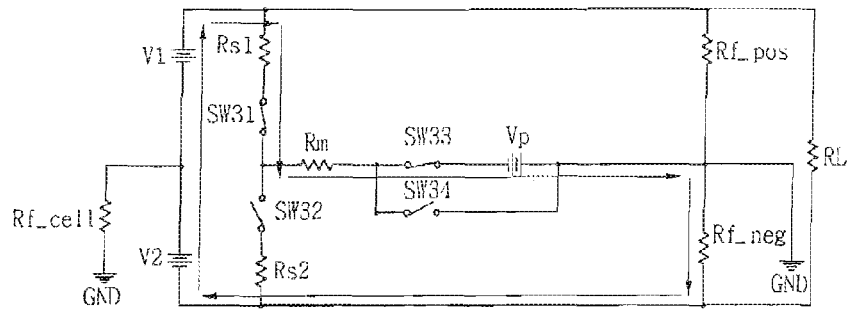
Figure 22:
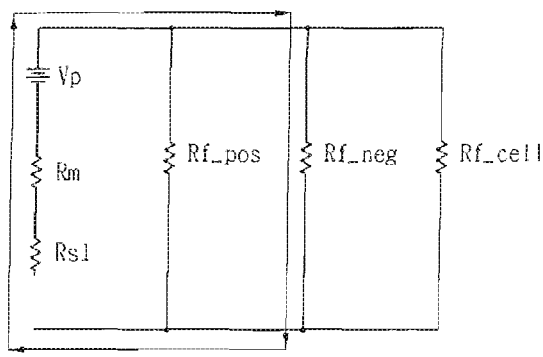

Hereinafter, the electrical leak detecting apparatus for an electric vehicle 300 when an electrical leak is generated when the vehicle body GND is connected to the minimum potential terminal of the battery pack 110, will be described. When the electrical leak is generated when the vehicle body GND is connected to the minimum potential terminal of the battery pack 110, current flows through the electrical leak detecting apparatus for an electric vehicle 300 via the minimum potential insulation resistor $Rf_{\_neg}$. In this regard, the electrical leak detecting apparatus for an electric vehicle 300 turns on the first switch SW31 and the third switch SW33 and turns off the second switch SW32 and the fourth switch SW34. Thus, the electrical leak detecting apparatus for an electric vehicle 300 forms a closed circuit, as illustrated in FIG. 21. In detail, in the electrical leak detecting apparatus for an electric vehicle 300, a closed circuit is formed between the battery pack 110, the minimum potential insulation resistor Rf$_{\_neg}$, the third switch SW33, the detection resistor R$_m$, the first switch SW31, and the first voltage distribution resistor Rs$_1$, respectively, so that current flows through the electrical leak detecting apparatus for an electric vehicle 300. In this regard, a both terminal voltage V$_m$, i.e., a voltage caused by current that flows through the detection resistor R$_m$, detected by the electrical leak detecting apparatus for an electric vehicle 300 is expressed using Equation 36:

$$V_m = \frac{R_m}{Rs_1 + R_m + Rf_{\_neg}}(V_1 + V_2 + Vp). \quad \text{Equation 36}$$

In the electrical leak detecting apparatus for an electric vehicle 300, a voltage (V$_1$+V$_2$) that is a voltage of the battery pack 110 should be obtained in order to obtain the value of the minimum potential insulation resistor Rf$_{\_neg}$ by using Equation 36. In the electrical leak detecting apparatus for an electric vehicle 300, in order to obtain the value of the minimum potential insulation resistor Rf$_{\_neg}$ by using only the measured potential supply unit Vp without being affected by (V$_1$+V$_2$) that is the voltage of the battery pack 110, the expression of the both terminal voltage V$_m$ is obtained by using only the measured potential supply unit Vp.

To this end, the electrical leak detecting apparatus for an electric vehicle 300 turns on the the first switch SW31 and the fourth switch SW34 and turns off the second switch SW32 and the third switch SW33. In the electrical leak detecting apparatus for an electric vehicle 300, a closed circuit is formed between the battery pack 110, the minimum potential insulation resistor Rf$_{\_neg}$, the fourth switch SW34, the detection resistor R$_m$, the first switch SW31, and the first voltage distribution resistor Rs$_1$, respectively, so that current flows through the electrical leak detecting apparatus for an electric vehicle 300. In this regard, the both terminal voltage V$_m$ of the detection resistor R$_m$ measured by the electrical leak detecting apparatus for an electric vehicle 300 is expressed using Equation 37:

$$V_m = \frac{R_m}{Rs_1 + R_m + Rf_{\_neg}}(V_1 + V_2). \quad \text{Equation 37}$$

When Equation 37 is subtracted from Equation 36 so as to obtain the expression of the both terminal voltage V$_m$ by using only the measured potential supply unit Vp, the both terminal voltage V$_m$ of the detection resistor R$_m$ is expressed as shown Equation 38. The value of the minimum potential insulation resistor Rf$_{neg}$ may be obtained as shown in Equation 39 by using Equation 38:

$$V_m = \frac{R_m}{Rs_1 + R_m + Rf_{\_neg}}(Vp), \quad \text{Equation 38}$$

$$Rf_{\_neg} = \frac{R_m}{V_m}(Vp) - (Rs_1 + R_m). \quad \text{Equation 39}$$

In other words, the electrical leak detecting apparatus for an electric vehicle 300 measures the both terminal voltage V$_m$ of the detection resistor R$_m$ while turning on the first switch SW31 and sequentially turning on the third switch SW33 and the fourth switch SW34, thereby obtaining a value of the equalized minimum potential insulation resistor Rf$_{\_neg}$.

Also, when an electrical leak is generated when the vehicle body GND is connected to the minimum potential terminal of the battery pack 110, the electrical leak detecting apparatus for an electric vehicle 300 turns on the second switch SW32 and the turns off the first switch SW31, a circuit is opened with respect to the voltage (V$_1$+V$_2$) of the battery pack 110 so that current hardly flows through the detection resistor R$_m$. Thus, the electrical leak detecting apparatus for an electric vehicle 300 may detect an electrical leak of the electronic vehicle and a place where the electrical leak is generated.

Also, in the electrical leak detecting apparatus for an electric vehicle 300, as shown in Equations 36 and 37, since, when an electrical leak is generated when the vehicle body GND is connected to the minimum potential terminal of the battery pack 110, the voltage (V$_1$+V$_2$) of the battery pack 110 is applied to the detection resistor R$_m$, a detection sensitivity of the electrical leak detecting apparatus for an electric vehicle 300 is improved so that the both terminal voltage V$_m$ of the detection resistor R$_m$ may be easily measured.

Hereinafter, the electrical leak detecting apparatus for an electric vehicle 300 when an electrical leak is generated when the vehicle body GND is connected to the intermediate potential terminal of the battery pack 110, will be described. When the electrical leak is generated when the vehicle body GND is connected to the intermediate potential terminal of the battery pack 110, current flows through the electrical leak detecting apparatus for an electric vehicle 300 via the intermediate potential insulation resistor Rf$_{\_cell}$. In this regard, the electrical leak detecting apparatus for an electric vehicle 300 obtains a value of intermediate potential insulation resistor Rf$_{\_cell}$ in a state where the first switch SW1 is connected to the maximum potential terminal of the battery pack 110. Next, the electrical leak detecting apparatus for an electric vehicle 300 obtains a value of the intermediate potential insulation resistor. Rf$_{\_cell}$ in a state where the second switch SW2 is connected to the minimum potential terminal of the battery pack 110. The electrical leak detecting apparatus for an electric vehicle 300 calculates a place where an electrical leak is generated, using the ratio of the values obtained in the two cases. This will be described later in detail.

(i) Obtaining the Value of the Intermediate Potential Insulation Resistor Rf$_{\_cell}$ by Connecting the First Switch SW31

Figure 23:
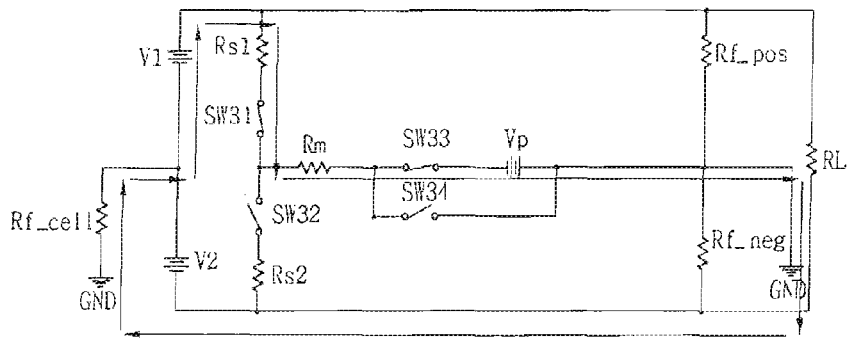

As illustrated in FIG. 23, the electrical leak detecting apparatus for an electric vehicle 300 sequentially turns on the third switch SW33 and the fourth switch SW34 in a state where the first switch SW31 is turned on. Thus, the electrical leak detecting apparatus for an electric vehicle 300 may obtain the value of the intermediate potential insulation resistor Rf$_{\_cell}$ in a similar way to obtaining the value of the maximum potential insulation resistor Rf$_{\_pos}$ described with reference to FIG. 19.

Figure 24:
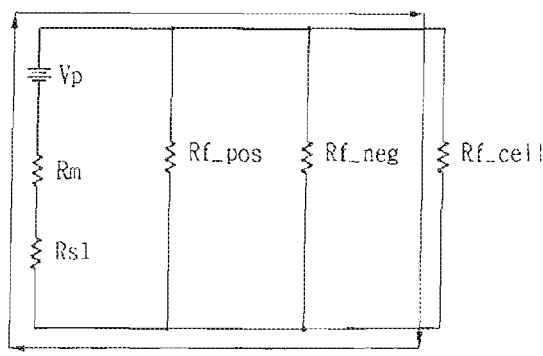

When the first switch SW31 and the third switch SW33 are turned on and the second switch SW32 and the fourth switch SW34 are turned off, the both terminal voltage V$_m$ of the detection resistor R$_m$ measured by the electrical leak detecting apparatus for an electric vehicle 300 is expressed as the following Equation 40. When the first switch SW31 and the fourth switch SW34 are turned on and the second switch. SW32 and the third switch SW33 are turned off, the both terminal voltage V$_m$ of the detection resistor R$_m$ measured by the electrical leak detecting apparatus for an electric vehicle 300 is expressed as the following Equation 41. When Equation 41 is subtracted from Equation 40, the both terminal voltage $V_m$ of the detection resistor $R_m$ caused by current that flows through the detection resistor $R_m$ may be expressed as shown in Equation 42, using only the measured potential supply unit Vp. The value of the intermediate potential insulation resistor $Rf_{\_cell}$ may be obtained using in Equation 43. In this regard, an equivalent circuit of the electrical leak detecting apparatus for an electric vehicle 300 is as illustrated in FIG. 24.

$$V_m = \frac{R_m}{Rs_1 + R_m + Rf_{\_cell}}(V_1 + Vp), \quad \text{Equation 40}$$

$$V_m = \frac{R_m}{Rs_1 + R_m + Rf_{\_cell}}(V_1), \quad \text{Equation 41}$$

$$V_m = \frac{R_m}{Rs_1 + R_m + Rf_{\_cell}}(Vp), \quad \text{Equation 42}$$

$$Rf_{\_cell} = \frac{R_m}{V_m}(Vp) - (Rs_1 + R_m). \quad \text{Equation 43}$$

(ii) Obtaining the Value of the of the Intermediate Potential Insulation Resistor $Rf_{\_cell}$ by Connecting the Second Switch SW32

Figure 25:
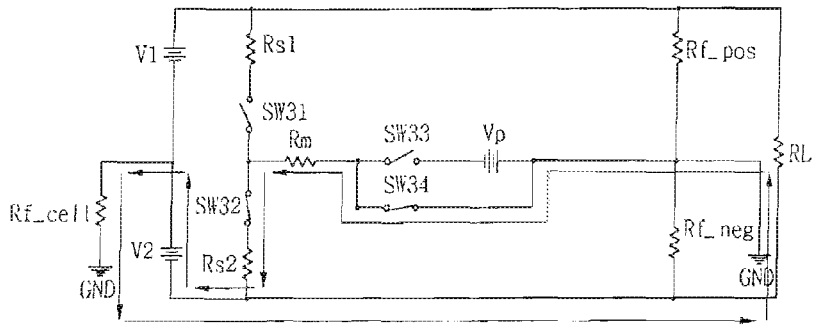

As illustrated in FIG. 25, the electrical leak detecting apparatus for an electric vehicle 300 connects the second switch SW32 and sequentially turns on the fourth switch SW34 and the third switch SW33. Thus, the electrical leak detecting apparatus for an electric vehicle 300 may obtain the value of the intermediate potential insulation resistor $Rf_{\_cell}$ in a similar way to obtaining the value of the minimum potential insulation resistor $Rf_{\_neg}$ described with reference to FIG. 21.

In this regard, when the second switch SW32 and the fourth switch SW34 are turned on and the first switch SW31 and the third switch SW33 are turned off, the both terminal voltage $V_m$ of the detection resistor $R_m$ measured by the electrical leak detecting apparatus for an electric vehicle 300 is expressed as shown in Equation 44.

Figure 26:
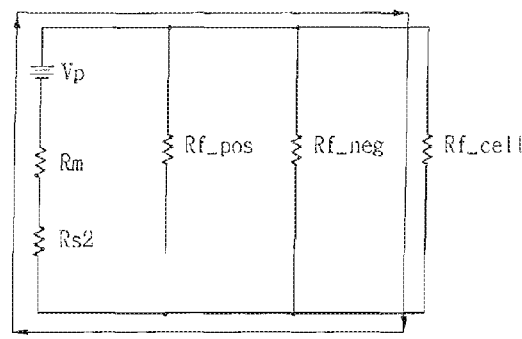

Also, when the second switch SW32 and the third switch SW33 are turned on and the first switch SW31 and the fourth switch SW34 are turned off, the both terminal voltage $V_m$ of the detection resistor $R_m$ is expressed as shown in Equation 45. When Equation 45 is subtracted from Equation 44, the both terminal voltage $V_m$ of the detection resistor $R_m$ is expressed as shown in Equation 46 using only the measured potential supply unit Vp. The value of the intermediate potential insulation resistor $Rf_{\_cell}$ by using this may be obtained as shown in Equation 47. In this regard, the equivalent circuit of the electrical leak detecting apparatus for an electric vehicle 300 is as illustrated in FIG. 26:

$$V_m = \frac{R_m}{Rs_2 + R_m + Rf_{\_cell}}(V_2), \quad \text{Equation 44}$$

$$V_m = \frac{R_m}{Rs_2 + R_m + Rf_{\_cell}}(V_2 - Vp), \quad \text{Equation 45}$$

$$V_m = \frac{R_m}{Rs_2 + R_m + Rf_{\_cell}}(Vp), \quad \text{Equation 46}$$

$$Rf_{\_cell} = \frac{R_m}{V_m}(Vp) - (Rs_2 + R_m). \quad \text{Equation 47}$$

(iii) Obtaining a Place where an Electrical Leak is Generated when the Vehicle Body GND is Connected to the Intermediate Potential of the Battery Pack 110

As described above, in the electrical leak detecting apparatus for an electric vehicle 300, when an insulation failure is generated at an intermediate point of the battery pack 110, a closed circuit is formed regardless of whether the first switch SW31 is turned on and the second switch SW32 is turned off or whether the first switch SW31 is turned off and the second switch SW32 is turned on, so that current flows through the detection resistor $R_m$. In this case, the electrical leak detecting apparatus for an electric vehicle 300 may detect that an electrical leak is generated at the intermediate point of the battery pack 110. Furthermore, as shown in Equations 40 and 41 and Equations 44 and 45, the detection voltage $V_m$ of the detection resistor $R_m$ when the second switch SW32 is connected and the detection voltage $V_m$ of the detection resistor $R_m$ when the first switch SW31 is connected, are different from each other according to a place where an electrical leak is generated at the intermediate point of the battery pack 110. Thus, the electrical leak detecting apparatus for an electric vehicle 300 may detect a place where the electrical leak of the electric vehicle is generated, by using the ratio of the values obtained in the two cases.

Hereinafter, the electrical leak detecting apparatus for an electric vehicle 300 when a complex electrical leak is generated in the battery pack 110 will be described. When an electrical leak is generated in two or more places among the maximum potential terminal, the minimum potential terminal, and the intermediate potential of the battery pack 110, current flows through the electrical leak detecting apparatus for an electric vehicle 300 via the corresponding maximum potential insulation resistor $Rf_{\_pos}$ the corresponding minimum potential insulation resistor $Rf_{\_neg}$, and the corresponding intermediate potential insulation resistor $Rf_{\_cell}$.

Figure 27:
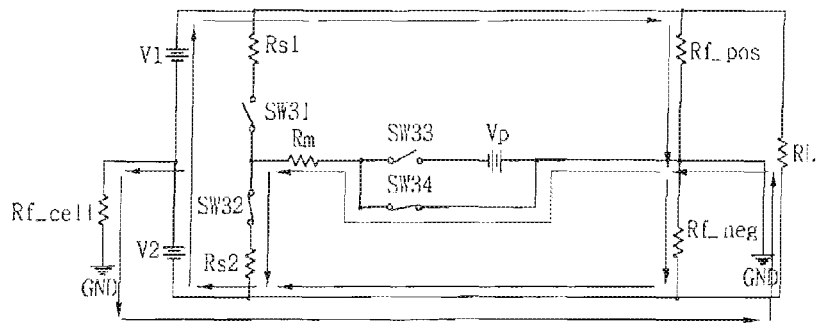

When an electrical leak is generated at all of the maximum potential terminal, the minimum potential terminal, and the intermediate potential of the battery pack 100, the electrical leak detecting apparatus for an electric vehicle 300 turns on the second switch SW32 and the fourth switch SW34 connected to the minimum potential terminal of the battery pack 110 and turns off the first switch SW31 and the third switch SW33. Thus, current flows through the electrical leak detecting apparatus for an electric vehicle 300 via the maximum potential insulation resistor $Rf_{\_pos}$, the minimum potential insulation resistor $Rf_{\_neg}$, and the intermediate potential insulation resistor $Rf_{\_cell}$. Thus, the electrical leak detecting apparatus for an electric vehicle 300 forms a closed circuit, as illustrated in FIG. 27. In this regard, the both terminal voltage $V_m$ of the detection resistor $R_m$ may be detected. It would have been easily understood by one of ordinary skill in the art that the voltage of the battery pack 100 and the measured voltage $V_m$ are derived from Equations with respect to the both terminal voltage $V_m$ applied to the detection resistor $R_m$ in a state where the second switch SW32 and the third switch SW33 are turned on and in a state where the second switch SW32 and the fourth switch SW34 are turned on, respectively, by using an overlapping principle. Thus, a detailed description thereof will not be provided here.

Figure 28:
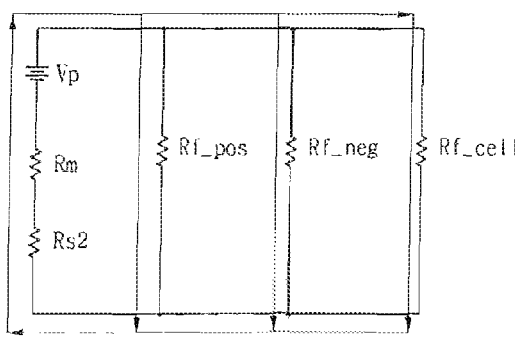

The electrical leak detecting apparatus for an electric vehicle 300 turns on the second switch SW32 and the third switch SW33 of the battery pack 110 and turns off the first switch SW31 and the fourth switch SW34 so as to remove the effect of $(V_1+V_2)$, like in the previous way. Thus, current flows through the electrical leak detecting apparatus for an electric vehicle 300 via the maximum potential insulation resistor $Rf_{\_pos}$, the minimum potential insulation resistor $Rf_{\_neg}$, and the intermediate potential insulation resistor $Rf_{\_cell}$, and the electrical leak detecting apparatus for an electric vehicle 300 may detect the both terminal voltage $V_m$ of the detection resistor $R_m$. The both terminal voltage $V_m$ of the detection resistor $R_m$ is expressed as shown in Equation 48 by subtracting a voltage value detected at this time from a voltage value detected immediately before and by dividing the result of subtraction by 2. In this regard, the maximum potential insulation resistor $Rf_{\_pos}$, the minimum potential insulation resistor $Rf_{\_neg}$, and the intermediate potential insulation resistor $Rf_{\_cell}$ are connected to one another in parallel. An equivalent circuit of the electrical leak detecting apparatus for an electric vehicle 300 is as illustrated in FIG. 28.

$$V_m = \frac{R_m}{R_{s2} + R_m + Rf_{\_total}}(Vp), \quad \text{Equation 48}$$

where a total potential insulation resistor $Rf_{\_total}$ is an equivalent circuit of the maximum potential insulation resistor $Rf_{\_pos}$, the minimum potential insulation resistor $Rf_{\_neg}$, and the intermediate potential insulation resistor $Rf_{\_cell}$, which are connected to one another in parallel.

A value of the total potential insulation resistor $Rf_{\_total}$ is expressed as the following Equation 49 in which the voltage of the battery pack 110 is not included, by using the Equation of the both terminal voltage $V_m$ of the detection voltage $R_m$.

Similarly, even when the electrical leak detecting apparatus for an electric vehicle 300 turns on the first switch SW31 connected to the maximum potential terminal of the battery pack 110 and sequentially turns on the second switch SW34 and the third switch SW33, the both terminal voltage $V_m$ of the detection resistor $R_m$ is expressed as shown Equation 49 in which the voltage of the battery pack 110 is not included:

$$Rf_{\_total} = \frac{R_m}{V_m}(Vp) - (R_{s2} + R_m). \quad \text{Equation 49}$$

Thus, the electrical leak detecting apparatus for an electric vehicle 300 may obtain the same result even in any failure.

Fourth Embodiment

Figure 29:
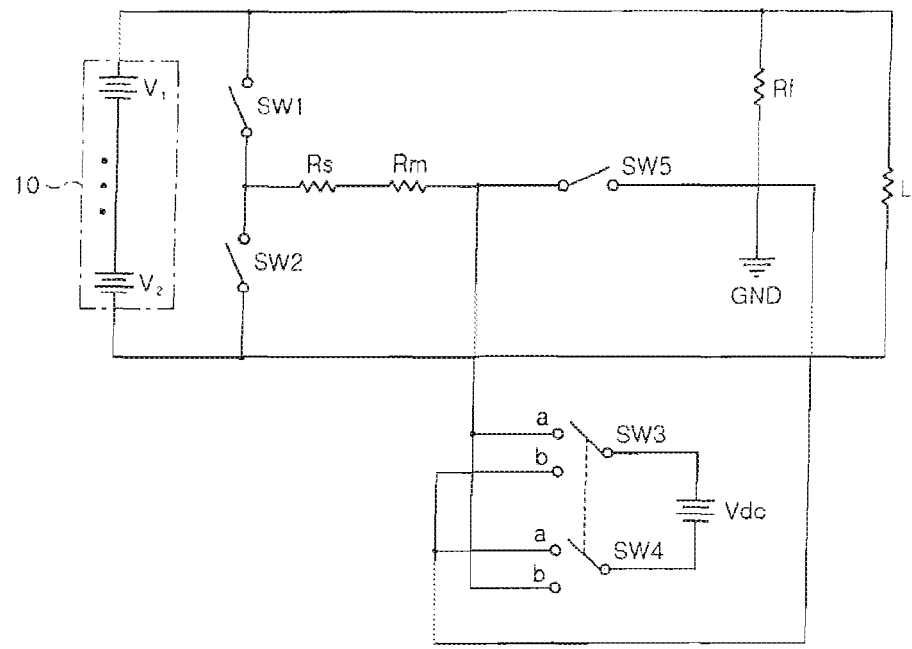
FIG. 29 illustrates an electrical leak detecting apparatus for an electric vehicle, according to another embodiment of the present invention.

FIG. 29 illustrates an electrical leak detecting apparatus for an electric vehicle, according to another embodiment of the present invention.

Referring to FIG. 29, the electrical leak detecting apparatus for an electric vehicle, according to the current embodiment includes a battery pack 10, a first switch element SW1 connected to a positive electrode of the battery pack 10 in parallel, a second switch element SW2 not only connected to a negative electrode of the battery pack 10 in parallel but also connected to the first switch element SW1 in series, a detection resistor $R_m$ connected to the first and second switch elements SW1 and SW2 in series, a measured potential supply unit $V_{dc}$ connected to the detection resistor $R_m$ in series, and a ground switch SW5 connected between the detection resistor $R_m$ and a vehicle body GND and grounding the detection resistor $R_m$ and the vehicle body GND. The electrical leak detecting apparatus for an electric vehicle according to the present invention further includes first and second polarity conversion switches SW3 and SW4 connecting the measured potential supply unit $V_{dc}$ to the detection resistor $R_m$ and the vehicle body GND.

Figure 30:
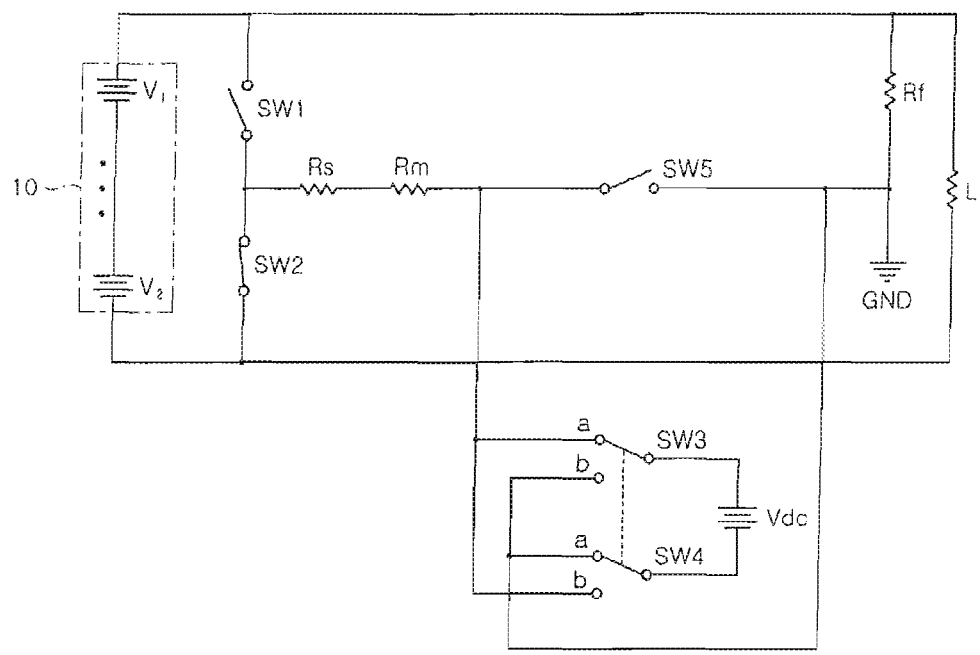
FIGS. 30 through 35 illustrate a maximum potential insulation failure mode.
Figure 31:
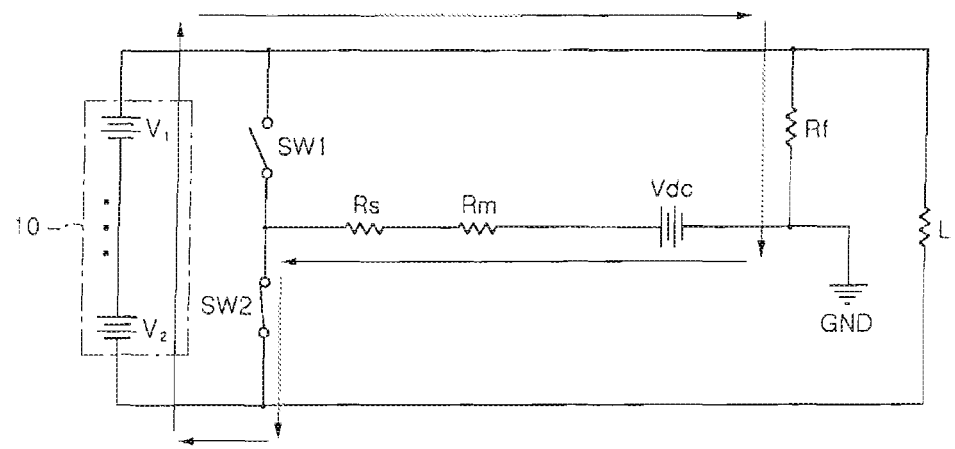

A method of detecting an electrical leak by using the electrical leak detecting apparatus for an electric vehicle according to the present invention, is in a maximum potential insulation failure detection mode. In other words, as illustrated in FIG. 30, when the first and second polarity conversion switches SW3 and SW4 are turned on with a, and the first switch SW1 is turned off, the second switch SW2 is turned on and a fifth switch SW5 is turned off, if an insulation resistor $R_f$ between the maximum potential of the battery pack 10 and the vehicle body GND is destroyed, a closed circuit as illustrated in FIG. 31 is formed, and a voltage $V_m$ as shown in the following Equation 50 is detected from the detection resistor $R_m$.

$$V_{m^+} = \frac{R_m}{R_s + R_m + R_f}(V_1 + V_2 + V_{dc}) \quad \text{Equation 50}$$

Figure 32:
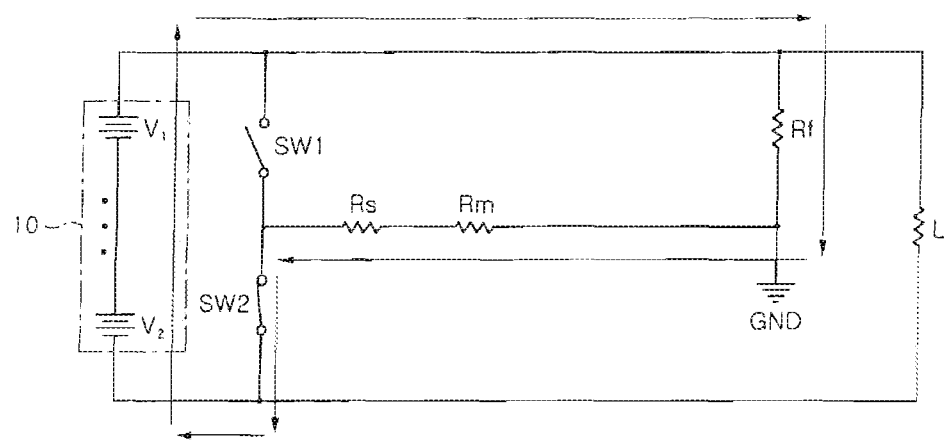

When the first and second polarity conversion switches SW3 and SW4 are turned off and the fifth switch SW5 are turned on, a closed circuit as illustrated in FIG. 32 is formed, and a voltage $V_m$ as shown in the following Equation 51 is detected from the detection resistor $R_m$.

$$V_m 0 = \frac{R_m}{R_s + R_m + R_f}(V_1 + V_2). \quad \text{Equation 51}$$

When Equation 51 is subtracted from Equation 50, $V_m$ may be obtained using only the measured potential supply unit $V_{dc}$, as shown in the following Equation 52.

$$V_m = \frac{R_m}{R_s + R_m + R_f}V_{dc} \quad \text{Equation 52}$$

As known from the voltage $V_m$ using only the measured potential supply unit $V_{dc}$ shown in Equation 52, an electrical leak is generated when the maximum potential of the battery pack 10 and the vehicle body GND are connected to each other.

Figure 33:
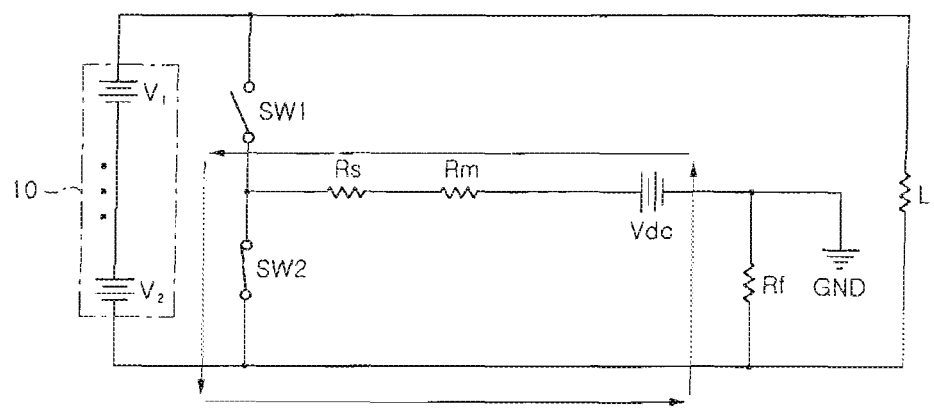

As illustrated in FIG. 30, when the first and second polarity conversion switches SW3 and SW4 are turned on with a, and the first switch SW1 is turned off, the second switch SW2 is turned on and a fifth switch SW5 is turned off, if an insulation resistor $R_f$ between the minimum potential of the battery pack 10 and the vehicle body GND is destroyed, a closed circuit as illustrated in FIG. 33 is formed, and a voltage $V_m$ as shown in the following Equation 53 is detected from the detection resistor $R_m$.

$$V_{m^+} = \frac{R_m}{R_s + R_m + R_f}V_{dc} \quad \text{Equation 53}$$

In this regard, the measured potential supply unit $V_{dc}$ is relatively smaller than the voltage of the battery pack 110, and thus, the actually-detected voltage $V_m$ is very small. When the first and second polarity conversion switches SW3 and SW4 are turned off and the fifth switch SW5 is turned on, a voltage source disappears, and the detection voltage $V_m$ is 0. Thus, in the method of detecting an electrical leak by using the electrical leak detecting apparatus for an electric vehicle according to the present invention, the detection voltage $V_m$ is very low in the maximum potential insulation failure detection mode, insulation failure with the minimum potential of the battery pack 10 is not detected but is detected in a minimum potential failure detection mode of the present invention.

Figure 34:
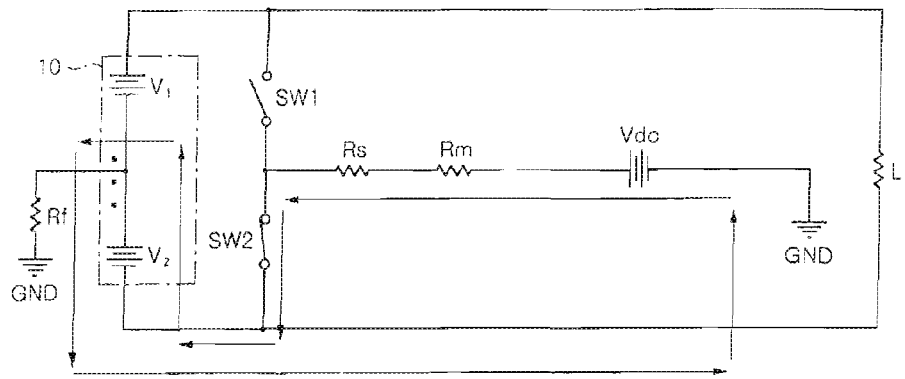

Also, in the method of detecting an electrical leak by using the electrical leak detecting apparatus for an electric vehicle according to the present invention, as illustrated in FIG. 30, when the first and second polarity conversion switches SW3 and SW4 are turned on with a, the first switch SW1 is turned off, the second switch SW2 is turned on and the fifth switch is turned off, if an insulation resistor $R_f$ between an intermediate potential of the battery pack 10 and the vehicle body GND is destroyed, a closed circuit as illustrated in FIG. 34 is formed, and a voltage $V_m$ as shown in Equation 54 is detected from the detection resistor $R_m$.

$$V_{m^+} = \frac{R_m}{R_s + R_m + R_f}(V_2 + V_{dc}) \qquad \text{Equation 54}$$

Figure 35:
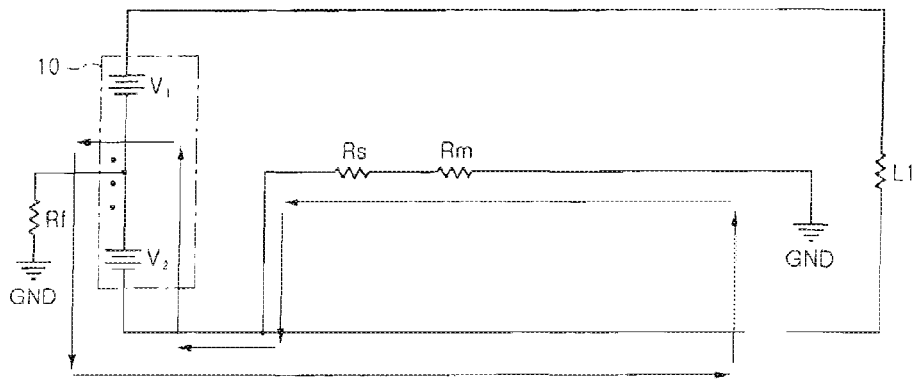

When the first and second polarity conversion switches SW3 and SW4 are turned off and the fifth switch SW5 is turned on, a closed circuit as illustrated in FIG. 35 is formed, and a voltage $V_m$ as shown in the following Equation 55 is detected from the detection resistor $R_m$.

$$V_m0 = \frac{R_m}{R_s + R_m + R_f} V_2 \qquad \text{Equation 55}$$

When Equation 55 is subtracted from Equation 54, $V_m$ may be obtained using only the measured potential supply unit $V_{dc}$, as shown in the following Equation 56.

$$V_m = \frac{R_m}{R_s + R_m + R_f} V_{dc} \qquad \text{Equation 56}$$

Figure 36:
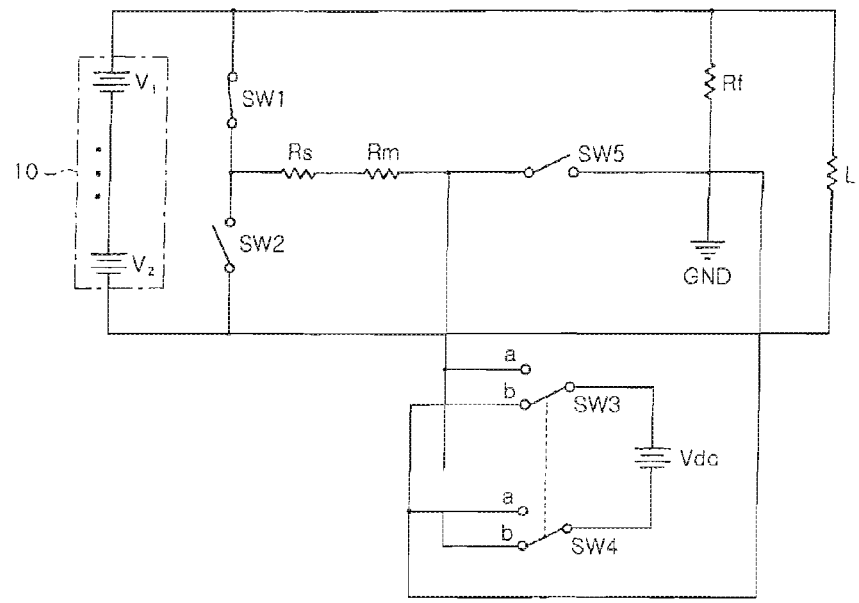
FIGS. 36 through 41 illustrate a minimum potential insulation failure mode.
Figure 37:
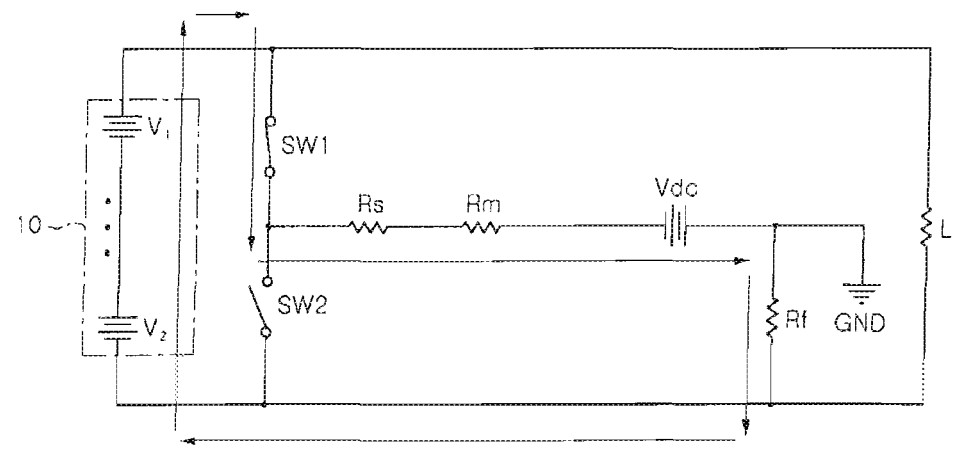

Meanwhile, the method of detecting an electrical leak by using the electrical leak detecting apparatus for an electric vehicle according to the present invention is in the minimum potential insulation failure detection mode. In other words, as illustrated in FIG. 36, when the first and second polarity conversion switches SW3 and SW4 are turned on with b, and the first switch SW1 is turned on, the second switch SW2 is turned off and a fifth switch SW5 is turned off, if an insulation resistor $R_f$ between the minimum potential of the battery pack 10 and the vehicle body GND is destroyed, a closed circuit as illustrated in FIG. 37 is formed, and a voltage $V_m$ as shown in the following Equation 57 is detected from the detection resistor $R_m$.

$$V_{m^+} = \frac{R_m}{R_s + R_m + R_f}(V_1 + V_2 + V_{dc}) \qquad \text{Equation 57}$$

Figure 38:
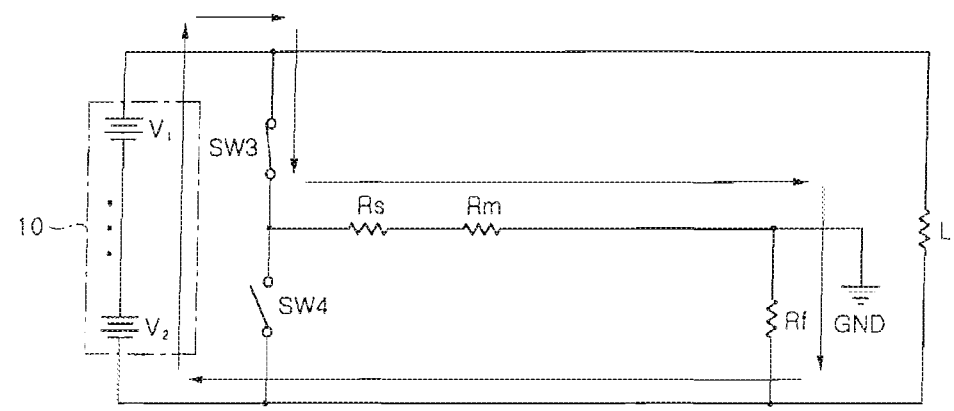

When the first and second polarity conversion switches SW3 and SW4 are turned off and the fifth switch SW5 are turned on, a closed circuit as illustrated in FIG. 38 is formed, and a voltage $V_m$ as shown in the following Equation 58 is detected from the detection resistor $R_m$.

$$V_m0 = \frac{R_m}{R_s + R_m + R_f}(V_1 + V_2). \qquad \text{Equation 58}$$

When Equation 58 is subtracted from Equation 57, $V_m$ may be obtained using only the measured potential supply unit $V_{dc}$, as shown in the following Equation 59.

$$V_m = \frac{R_m}{R_s + R_m + R_f} V_{dc} \qquad \text{Equation 59}$$

As known from the voltage $V_m$ using only the measured potential supply unit $V_{dc}$ shown in Equation 59, an electrical leak is generated when the maximum potential of the battery pack 10 and the vehicle body GND are connected to each other.

Figure 39:
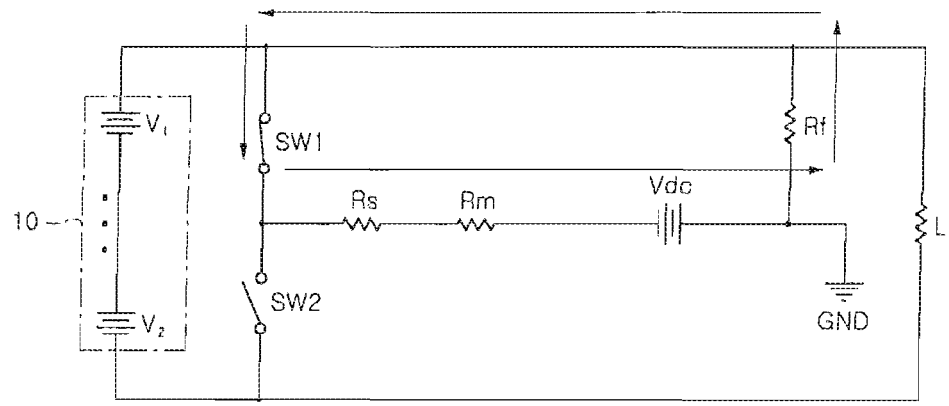

As illustrated in FIG. 36, when the first and second polarity conversion switches SW3 and SW4 are turned on with b, and the first switch SW1 is turned off, the second switch SW2 is turned on and a fifth switch SW5 is turned off, if an insulation resistor $R_f$ between the maximum potential of the battery pack 10 and the vehicle body GND is destroyed, a closed circuit as illustrated in FIG. 39 is formed, and a voltage $V_m$ as shown in the following Equation 60 is detected from the detection resistor $R_m$.

$$V_{m^+} = \frac{R_m}{R_s + R_m + R_f} V_{dc} \qquad \text{Equation 60}$$

In this regard, the measured potential supply unit $V_{dc}$ is relatively smaller than the voltage of the battery pack 110, and thus, the actually-detected voltage $V_m$ is very small. When the first and second polarity conversion switches SW3 and SW4 are turned off and the fifth switch SW5 is turned on, a voltage source disappears, and the detection voltage $V_m$ is 0. Thus, in the method of detecting an electrical leak by using the electrical leak detecting apparatus for an electric vehicle according to the present invention, the detection voltage $V_m$ is very low in the minimum potential insulation failure detection mode, insulation failure with the maximum potential of the battery pack 10 is not detected but is detected in the maximum potential failure detection mode of the present invention.

Figure 40:
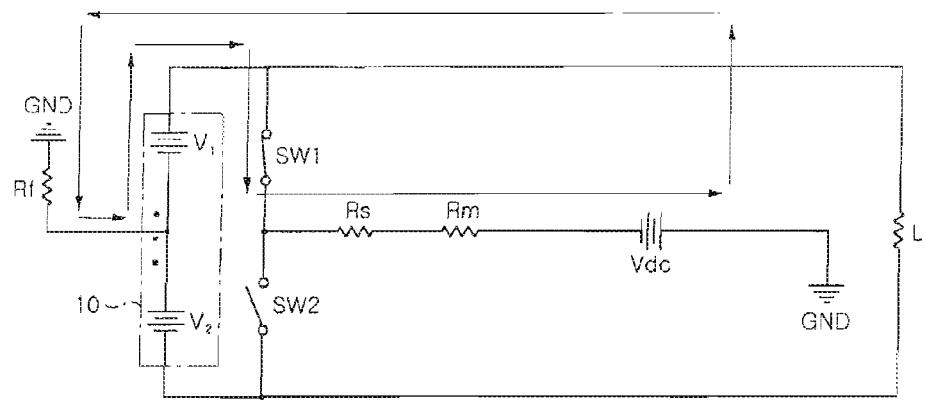

Also, in the method of detecting an electrical leak by using the electrical leak detecting apparatus for an electric vehicle according to the present invention, as illustrated in FIG. 36, when the first and second polarity conversion switches SW3 and SW4 are turned on with b, the first switch SW1 is turned on, the second switch SW2 is turned off and the fifth switch is turned off, if an insulation resistor $R_f$ between the intermediate potential of the battery pack 10 and the vehicle body GND is destroyed, a closed circuit as illustrated in FIG. 40 is formed, and a voltage $V_m$ as shown in Equation 61 is detected from the detection resistor $R_m$.

$$V_{m^+} = \frac{R_m}{R_s + R_m + R_f}(V_1 + V_{dc}) \qquad \text{Equation 61}$$

Figure 41:
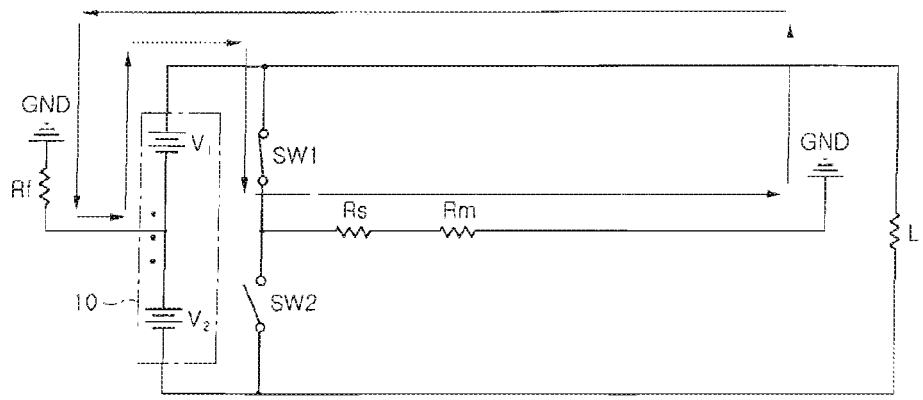

When the first and second polarity conversion switches SW3 and SW4 are turned off and the fifth switch SW5 is turned on, a closed circuit as illustrated in FIG. 41 is formed, and a voltage $V_m$ as shown in the following Equation 62 is detected from the detection resistor $R_m$.

$$V_m 0 = \frac{R_m}{R_s + R_m + R_f} V_1 \quad \text{Equation 62}$$

When Equation 62 is subtracted from Equation 61, $V_m$ may be obtained using only the measured potential supply unit $V_{dc}$, as shown in the following Equation 63.

$$V_m = \frac{R_m}{R_s + R_m + R_f} V_{dc} \quad \text{Equation 63}$$

As known from the voltage $V_m$ using only the measured potential supply unit $V_{dc}$ shown in Equation 63, an electrical leak is generated when the intermediate potential of the battery pack 10 and the vehicle body GND are connected to each other.

In this manner, the electrical leak detecting apparatus for an electric vehicle according to one or more of the embodiments of the present invention may differentiate maximum potential insulation failure, intermediate potential insulation failure or minimum potential insulation failure of the battery pack 10 from each other. In other words, the electrical leak detecting apparatus for an electric vehicle determines failure detected in the maximum potential insulation failure detection mode as failure of the maximum potential and determines failure detected in the minimum potential insulation failure detection mode as failure of the minimum potential. If failure is detected in both the maximum potential insulation failure detection mode and the minimum potential insulation failure detection mode, failure of the intermediate potential may be determined, and which portion of intermediate potential failure is generated may be known proportional to values $V_1$ and $V_2$ by comparing a detection voltage $V_{m+}$ in the maximum potential insulation failure detection mode with a detection voltage $V_{m+}$ in the minimum potential insulation failure detection mode. For example, if the ratio of the values $V_1$ and $V_2$ is 2:3, the portion of the intermediate potential failure is generated may be a portion having a voltage of ⅗ from the minimum potential of the battery pack 10.

Even when complex failure is generated as described above, failure is detected in both the maximum potential insulation failure detection mode and the minimum potential insulation failure mode like in the intermediate potential insulation failure detection mode. A way to differentiate detecting intermediate potential failure and complex potential failure is to determine potential failure where a detected voltage value is relatively large, as intermediate potential failure. The reason for this is because, if complex failure occurs, current is differentiated from each other by using each failure resistor compared to the case where failure occurs only in the intermediate potential and current flowing through the detection resistor is small and the value of the detected voltage is decreased.

Figure 42:
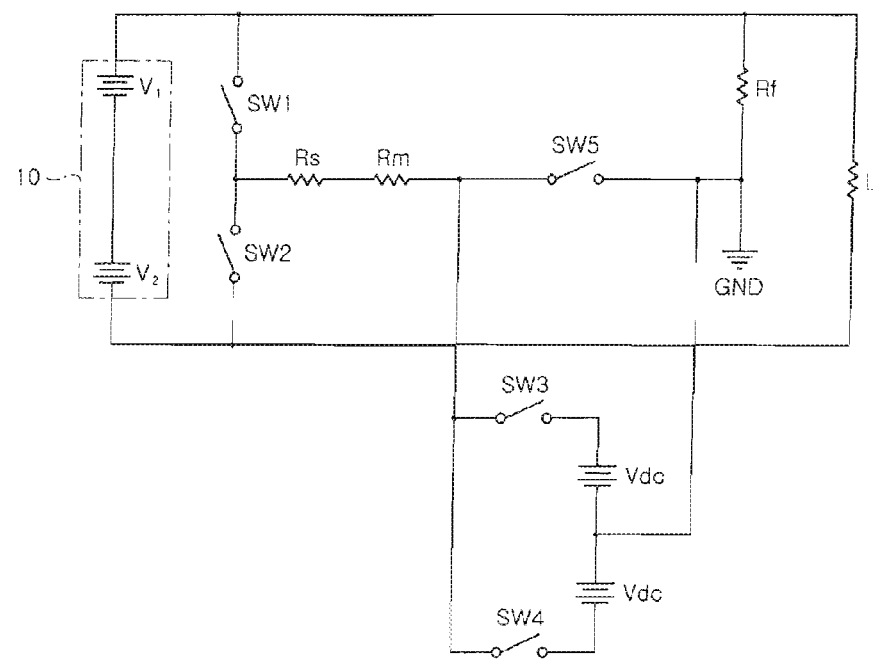
FIG. 42 illustrates an electrical leak detecting apparatus for an electric vehicle, according to another embodiment of the present invention.

FIG. 42 illustrates an electrical leak detecting apparatus for an electric vehicle, according to another embodiment of the present invention. Referring to FIG. 42, the electrical leak detecting apparatus for an electric vehicle, according to the current embodiment includes first and second measured potential supply units $V_{dc1}$ and $V_{dc2}$, a first measured potential supply unit connection switch SW3 that connects a positive electrode of the first measured potential supply unit $V_{dc1}$ to a detection resistor $R_m$ and connects a negative electrode of the first measured potential supply unit $V_{dc1}$ to a vehicle body GND, and a second measured potential supply unit connection switch SW4 that connects a negative electrode of the second measured potential supply unit $V_{dc2}$ to the detection resistor $R_m$ and connects a positive electrode of the second measured potential supply unit $V_{dc2}$ to the vehicle body GND.

Meanwhile, in the electrical leak detecting apparatus for an electric vehicle according to the embodiments of the present invention as illustrated in FIGS. 29 and 42, although the voltage distribution resistor $R_s$ is disposed in a rear end of the first switch SW1, the voltage distribution resistor $R_s$ may be disposed in a front end of the first switch SW1 and the second switch SW2, respectively. Also, the order of the voltage distribution resistor, the detection resistor, the measured power supply source, and the switch, which are connected to one another in series, may be reverse.

In an electrical leak detecting apparatus for an electric vehicle according to the present invention, not only an electrical leak generated when a vehicle body is connected to a battery pack, can be easily detected regardless of a place of the battery pack where the electrical leak is generated, but also the place of the battery pack where the electrical leak is generated, can be detected.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electrical leak detecting apparatus for an electric vehicle, the apparatus comprising:
a first switch and a second switch connected to each other in series between a maximum potential terminal and a minimum potential terminal of a battery pack;
a detection resistor having one end connected to a common contact of the first and second switches; and
a measured potential supply unit connected between the other end of the detection resistor and a vehicle body and providing a potential to the battery pack.

2. The apparatus of claim 1, further comprising:
a third switch connected between the other end of the detection resistor and the vehicle body and providing the measured potential to the battery pack or cutting off the measured potential from the battery pack; and
a fourth switch connected to the third switch in parallel between the other end of the detection resistor and the vehicle body.

3. The apparatus of claim 1, further comprising:
a third switch connected between the other end of the detection resistor and the vehicle body; and
a fourth switch connected to the third switch in parallel between the other end of the detection resistor and the vehicle body and providing the measured potential to the battery pack or cutting off the measured potential from the battery pack.

4. The apparatus of claim 1, wherein one of the first switch and the second switch is turned on and the other one is turned off, and the measured potential is provided to the battery pack, and a both terminal voltage of the detection resistor is measured in such a way that whether an electrical leak is generated when the battery pack is connected to the vehicle body is able to be detected and a place where the electrical leak is generated is able to be detected.

5. The apparatus of claim 1, further comprising a voltage distribution resistor connected between a maximum potential terminal of the battery pack and the detection resistor.

6. The apparatus of claim 1, further comprising a voltage distribution resistor connected between a minimum potential terminal of the battery pack and the detection resistor.

7. An electrical leak detecting apparatus for an electric vehicle, the apparatus comprising:
 a first switch and a second switch connected to each other in series between a maximum potential terminal and a minimum potential terminal of a battery pack;
 a detection resistor having one end connected to a common contact of the first and second switches; and
 a first measured potential supply unit and a second measured potential supply unit providing first and second measured potentials, of different potential, to the battery pack,
 wherein the first measured potential supply unit or the second measured potential supply unit is connected between the other end of the detection resistor and a vehicle body in parallel, and
 one of the first measured potential and the second measured potential is provided to the battery pack.

8. The apparatus of claim 7, wherein the first measured potential and the second measured potential have the same voltage values and opposite polarities.

9. The apparatus of claim 7, further comprising a third switch providing the first measured potential to the battery pack or cutting off the first measured potential from the battery pack.

10. The apparatus of claim 7, further comprising a fourth switch providing the second measured potential to the battery pack or cutting off the first measured potential from the battery pack.

11. The apparatus of claim 7, wherein one of the first switch and the second switch is turned on and the other one is turned off, and one of the first measured potential and the second measured potential is provided to the battery pack, and a both terminal voltage of the detection resistor is measured in such a way that whether an electrical leak is generated when the battery pack is connected to the vehicle body is able to be detected and a place where the electrical leak is generated is able to be detected.

12. An electrical leak detecting apparatus for an electric vehicle, the apparatus comprising:
 a first switch element connected to a positive electrode of a battery pack in parallel;
 a second switch element not only connected to a negative electrode of the battery pack in parallel but also connected to the first switch element in series;
 a voltage distribution resistor connected to the first and second switch elements in series;
 a detection resistor connected between the voltage distribution resistor and a measured potential supply unit in series;
 the measured potential supply unit and a vehicle body connected to the detection resistor in series; and
 a ground switch connected between the detection resistor and the vehicle body and grounding the detection resistor and the vehicle body.

13. The apparatus of claim 12, further comprising first and second polarity conversion switches connecting the measured potential supply unit to the detection resistor and the vehicle body in series.

14. The apparatus of claim 12, wherein the measured potential supply unit comprises first and second measured potential supply units which are separated from each other.

15. The apparatus of claim 14, further comprising:
 a first measured potential supply unit connection switch connecting a positive electrode of the first measured potential supply unit to the detection resistor and connecting a negative electrode of the first measured potential supply unit to the vehicle body; and
 a second measured potential supply unit connection switch connecting a negative electrode of the second measured potential supply unit to the detection resistor and connecting a positive electrode of the second measured potential supply unit to the vehicle body.

16. A method of detecting an electrical leak for an electric vehicle, the method comprising:
 detecting a first voltage of a detection resistor when first and second polarity conversion switches are turned on with a first polarity, a first switch is turned off, a second switch is turned on and a ground switch is turned off;
 detecting a second voltage of the detection resistor by turning on the ground switch;
 obtaining a third voltage of the detection resistor by using a measured potential supply unit by subtracting the second voltage of the detection resistor from the first voltage of the detection resistor;
 detecting a fourth voltage of the detection resistor when the first and second polarity conversion switches are turned on with a second polarity, the first switch is turned on, the second switch is turned off and the ground switch is turned off;
 detecting a fifth voltage of the detection resistor by turning on the ground switch;
 obtaining a sixth voltage of the detection resistor by using the measured potential supply unit by subtracting the fifth voltage of the detection resistor from the fourth voltage of the detection resistor; and
 if the third voltage of the detection resistor is detected, determining maximum potential insulation failure, if the sixth voltage of the detection resistor is detected, determining minimum potential insulation failure, and if both the third voltage and the sixth voltage of the detection resistor are detected as insulation failure, determining intermediate potential insulation failure.

17. The method of claim 16, wherein, if both the third voltage and the sixth voltage of the detection resistor are detected and intermediate potential insulation failure is determined, which portion of the battery pack insulation failure is generated is detected by comparing the first voltage of the detection resistor with the fourth voltage of the detection resistor.

* * * * *